(12) United States Patent
Lee et al.

(10) Patent No.: US 12,380,944 B2
(45) Date of Patent: Aug. 5, 2025

(54) SEMICONDUCTOR APPARATUS AND SEMICONDUCTOR SYSTEM HAVING LUN SELECTION CYCLE, AND OPERATING METHOD OF SEMICONDUCTOR SYSTEM

(71) Applicant: SK hynix Inc., Icheon-si (KR)

(72) Inventors: Jae Young Lee, Icheon-si (KR); Won Sun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 76 days.

(21) Appl. No.: 18/509,955

(22) Filed: Nov. 15, 2023

(65) Prior Publication Data

US 2024/0419615 A1    Dec. 19, 2024

(30) Foreign Application Priority Data

Jun. 19, 2023 (KR) .......................... 10-2023-0078252

(51) Int. Cl.
  *G11C 11/4096*  (2006.01)
  *G06F 13/20*   (2006.01)
  *G11C 7/10*    (2006.01)
  *G11C 11/4093* (2006.01)

(52) U.S. Cl.
  CPC .......... *G11C 11/4096* (2013.01); *G06F 13/20* (2013.01); *G11C 7/1048* (2013.01); *G11C 7/1096* (2013.01); *G11C 11/4093* (2013.01); *G06F 2213/40* (2013.01)

(58) Field of Classification Search
  CPC . G06F 13/20; G06F 2213/40; G11C 11/4096; G11C 11/4093; G11C 7/1048; G11C 7/1096
  See application file for complete search history.

(56) References Cited

U.S. PATENT DOCUMENTS

| | | | |
|---|---|---|---|
| 9,977,731 B2 | 5/2018 | Pyeon et al. | |
| 2005/0243641 A1* | 11/2005 | Lee | G11C 7/1093 |
| | | | 365/230.02 |
| 2010/0058003 A1 | 3/2010 | Goto et al. | |
| 2016/0093293 A1 | 3/2016 | Siciliani et al. | |
| 2017/0018296 A1* | 1/2017 | Jeong | G11C 7/1045 |
| 2020/0150893 A1 | 5/2020 | Kim et al. | |
| 2022/0068428 A1* | 3/2022 | Paik | G11C 29/10 |
| 2023/0326517 A1* | 10/2023 | Lee | G06F 3/061 |

FOREIGN PATENT DOCUMENTS

KR    1020190013106 A    2/2019

* cited by examiner

*Primary Examiner* — Henry Tsai
*Assistant Examiner* — John B Roche
(74) *Attorney, Agent, or Firm* — WILLIAM PARK & ASSOCIATES LTD.

(57) ABSTRACT

A semiconductor system includes a first semiconductor apparatus and a second semiconductor apparatus. The first semiconductor apparatus transmits an address signal during an address cycle after transmitting a command signal during a command cycle. The first semiconductor apparatus transmits a selection signal during a logical unit number selection cycle before the command cycle. The second semiconductor apparatus performs a data input and output operation based on the selection signal, the command signal, and the address signal.

16 Claims, 17 Drawing Sheets

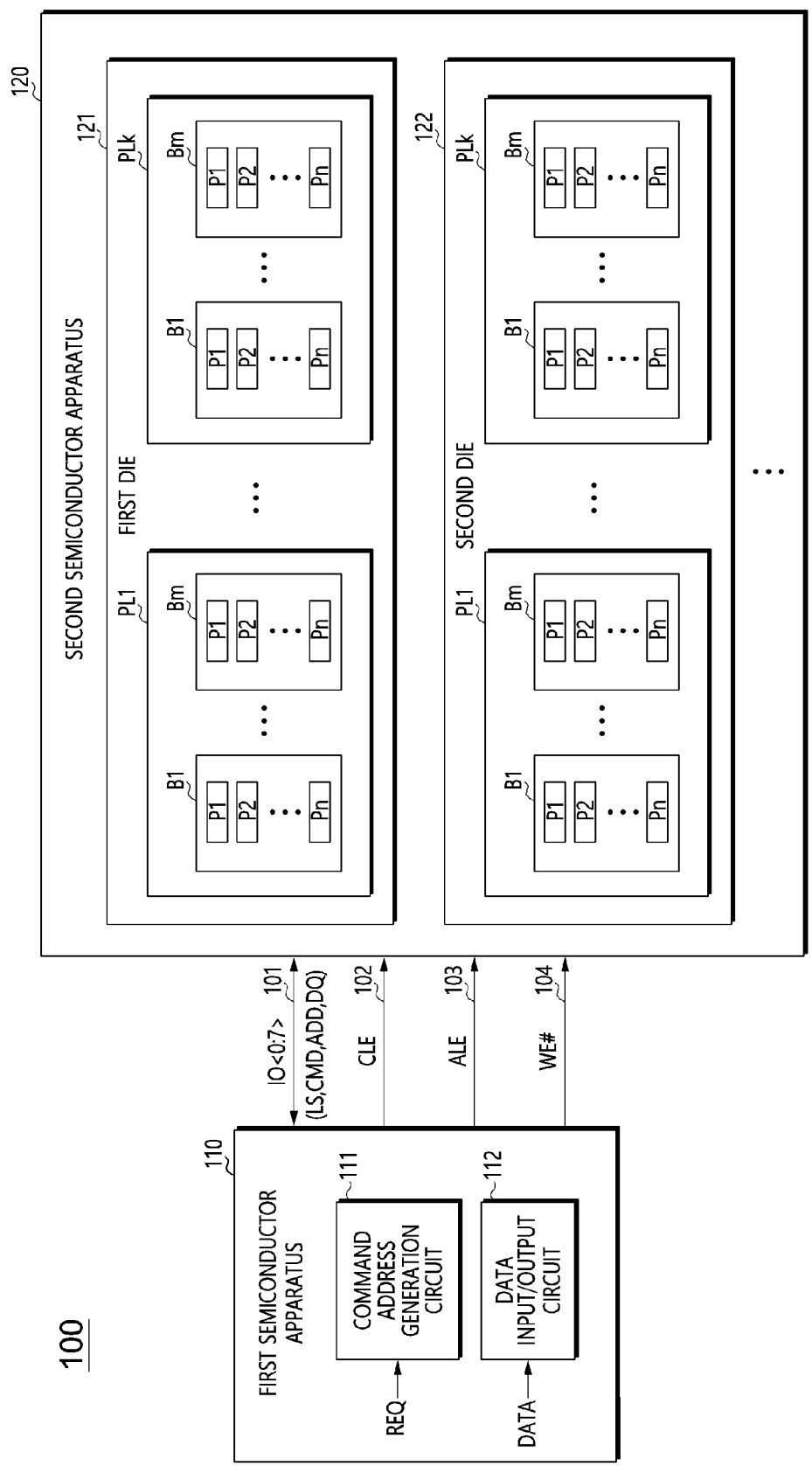

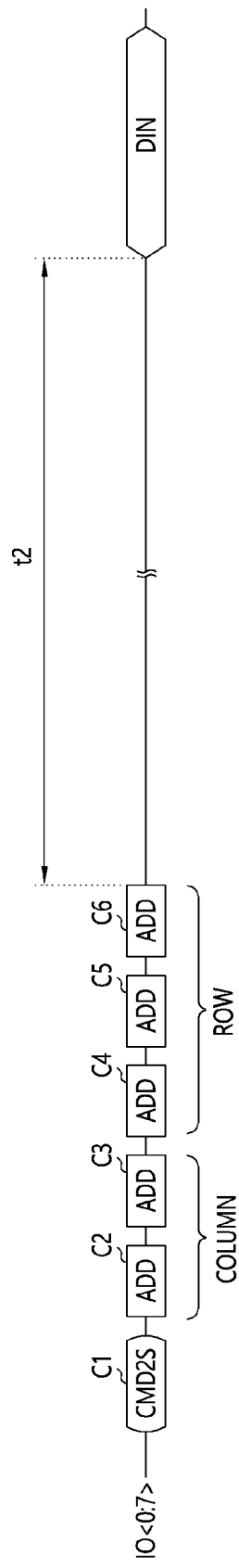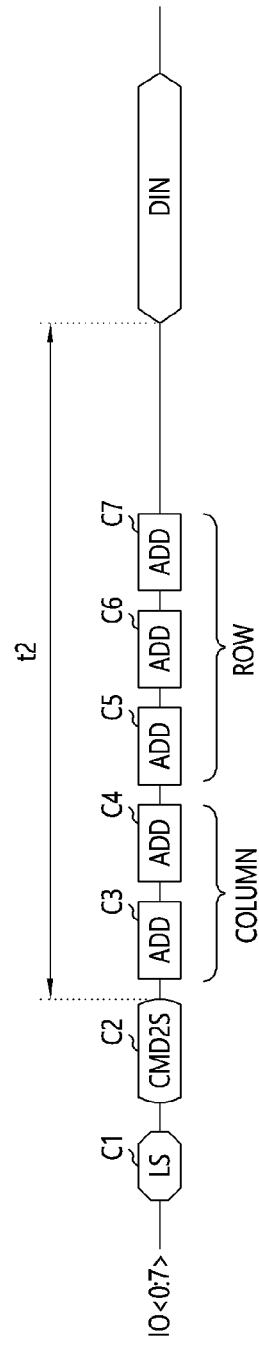

| BIT | <7> | <6> | <5> | <4> | <3> | <2> | <1> | <0> |
|-----|-----|-----|-----|-----|-----|-----|-----|-----|
| LS | Plane <0:3> | | | | LUN <0:3> | | | |

FIG. 12

| FIRST HEADER | | SECOND HEADER | | DEFINITION |
|---|---|---|---|---|
| CA<0> | CA<1> | CA<0> | CA<1> | |
| 0 | 0 | 0 | 0 | Data Output |
| 0 | 0 | 0 | 1 | Data Input |
| 1 | 0 | 0 | 0 | Address Input |
| 0 | 1 | 0 | 0 | Command Input |
| 1 | 1 | 1 | 0 | SCE |
| 1 | 1 | 0 | 1 | SCD |
| 1 | 1 | 1 | 1 | SCT |
| 1 | 1 | 0 | 0 | LUN Selection |

| | FIRST BODY | SECOND BODY | THIRD BODY | FOURTH BODY |
|---|---|---|---|---|
| CA<0> | S0 | S2 | S4 | S6 |
| CA<1> | S1 | S3 | S5 | S7 |

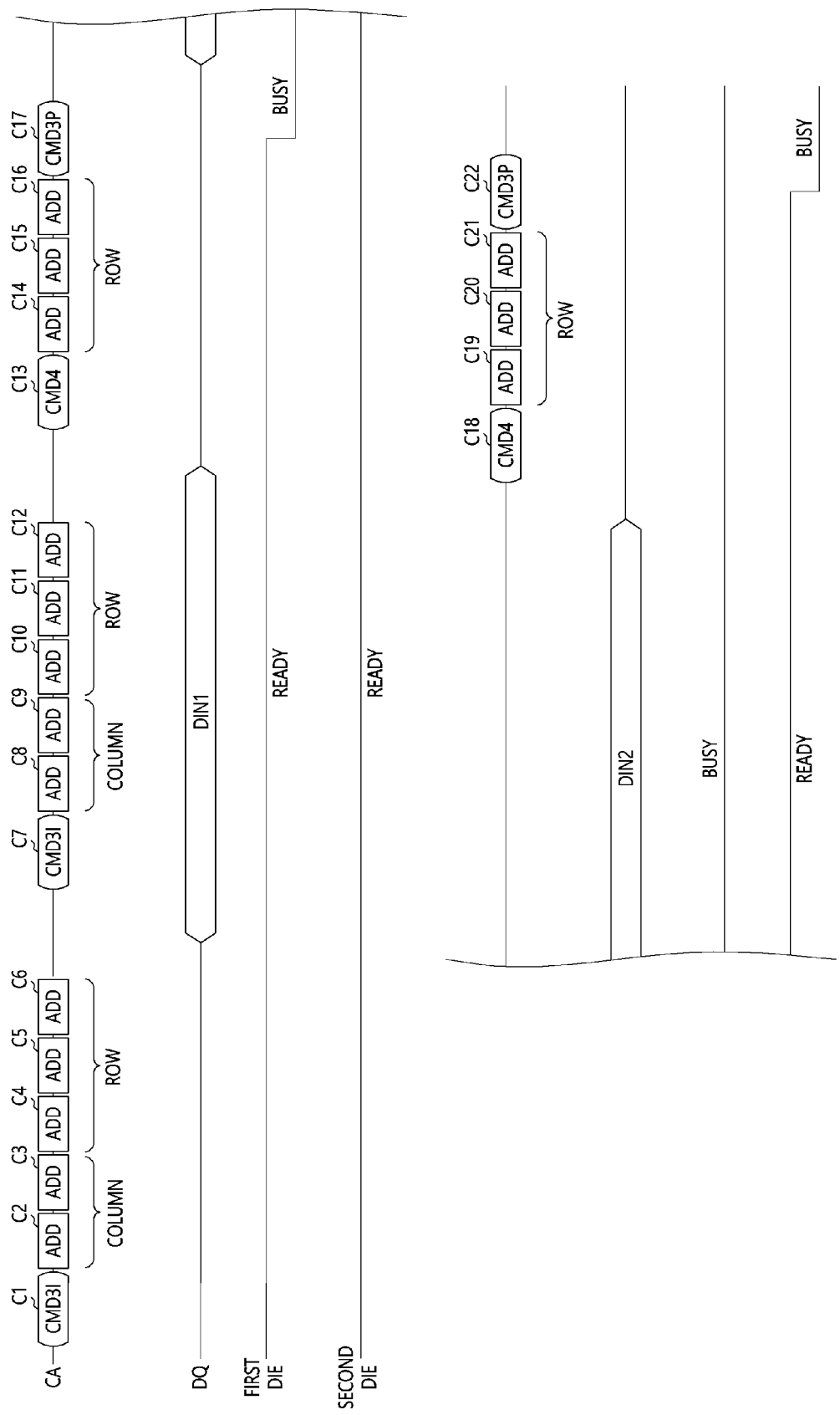

SEMICONDUCTOR APPARATUS AND SEMICONDUCTOR SYSTEM HAVING LUN SELECTION CYCLE, AND OPERATING METHOD OF SEMICONDUCTOR SYSTEM

CROSS-REFERENCES TO RELATED APPLICATION

The present application claims priority under 35 U.S.C. § 119(a) to Korean application number 10-2023-0078252, filed on Jun. 19, 2023, in the Korean Intellectual Property Office, which is incorporated herein by reference in its entirety.

BACKGROUND

1. Technical Field

The present disclosure relates to an integrated circuit technology, and more particularly, to a semiconductor apparatus and a semiconductor system having a LUN selection cycle.

2. Related Art

An electronic device includes many electronic components, and among them, a computer system may include many semiconductor apparatuses, each made of semiconductors. The semiconductor apparatuses constituting the computer system may include a processor or a memory controller operating as a master device and a memory apparatus or a storage device operating as a slave device. The master device may provide a command address signal to the slave device, and the slave device may perform various operations based on the command address signal. The master device and the slave device may also transmit and receive data to and from each other.

In a NAND flash memory system, a NAND flash memory apparatus may communicate with a memory controller through various interface methods. In a NAND interface method, a command address signal and data may be transmitted through substantially the same input and output bus. As the operating frequency of the NAND flash memory system increases, command overhead increases in the NAND interface method, which may cause a deterioration in the performance of the memory system. In a separate command address (SCA) interface method, a command address signal and data may be transmitted through different input and output buses. Although the SCA interface method may partially reduce the command overhead, an internal circuit of the NAND flash memory apparatus may be complicated in order to perform operations of a plurality of NAND flash memory apparatuses in parallel.

SUMMARY

A semiconductor system in accordance with an embodiment may include a first semiconductor apparatus and a second semiconductor apparatus. The first semiconductor apparatus may be configured to provide an input and output signal through an input and output bus, and to selectively enable a command latch enable signal and an address latch enable signal when transmitting the input and output signal. The second semiconductor apparatus may be configured to receive the input and output signal as one of a selection signal, a command signal, an address signal, and data based on the command latch enable signal and the address latch enable signal. When both the command latch enable signal and the address latch enable signal may be enabled, the second semiconductor apparatus may receive the input and output signal as the selection signal.

A semiconductor system in accordance with an embodiment may include a first semiconductor apparatus and a second semiconductor apparatus. The first semiconductor apparatus may be configured to provide a command address signal through a command address bus and to provide data through a data bus. The second semiconductor apparatus may be configured to receive the data from the first semiconductor apparatus or to transmit data to the first semiconductor apparatus through the data bus based on the command address signal. The command address signal may include a selection signal, a command signal, and an address signal, and the first semiconductor apparatus may sequentially provide the selection signal, the command signal, and the address signal.

A semiconductor system in accordance with an embodiment may include a semiconductor apparatus, a first die, and a second die. The semiconductor apparatus may be configured to provide a first command signal, a second command signal, an address signal, a first selection signal, and a second selection signal. The first die may be configured to receive first data from the semiconductor apparatus based on the first command signal and the address signal including information for selecting the first die, and to perform a program operation of the first data based on the first selection signal and the second command signal. The second die may be configured to receive second data from the semiconductor apparatus based on the first command signal and the address signal including information for selecting the second die, and to perform a program operation of the second data based on the second selection signal and the second command signal.

An operating method of a semiconductor system in accordance with an embodiment may include, by a first semiconductor apparatus, providing a data input command signal and an address signal including information for selecting a first die to a second semiconductor apparatus. The method may include, by the first semiconductor apparatus, transmitting first data to the second semiconductor apparatus. The method may include, by the first semiconductor apparatus, providing the data input command signal and an address signal including information for selecting a second die to the second semiconductor apparatus. The method may include, by the first semiconductor apparatus, providing a first selection signal and a program command signal to the second semiconductor apparatus. And the method may include, by the first semiconductor apparatus, transmitting second data to the second semiconductor apparatus.

A semiconductor apparatus in accordance with an embodiment may include a memory cell array and a control circuit. The memory cell array may include a plurality of planes. The control circuit may be configured to receive a command address signal set including a header and a body, to receive the command address signal set as one of a command signal, an address signal, and a selection signal based on logic levels of bits of the header, and to generate an internal selection signal and a plane address signal based on bits of the body when the command address signal set corresponds to one of the address signal and the selection signal. The semiconductor apparatus may be activated based on the internal selection signal and one of the plurality of planes may be selected based on the plane address signal.

BRIEF DESCRIPTION OF THE DRAWINGS

FIG. 1 is a diagram illustrating the configuration of a semiconductor system in accordance with an embodiment.

FIG. 3A is a timing diagram illustrating signals transmitted from the general semiconductor system during a data input operation.

FIG. 3B is a timing diagram illustrating signals transmitted from the semiconductor system in accordance with an embodiment during a data input operation.

FIG. 12 is a table illustrating command address signal sets in accordance with an embodiment.

FIG. 16A is a timing diagram illustrating signals transmitted to perform an interleaved operation from a semiconductor system in accordance with an embodiment.

DETAILED DESCRIPTION

Figure 2A:
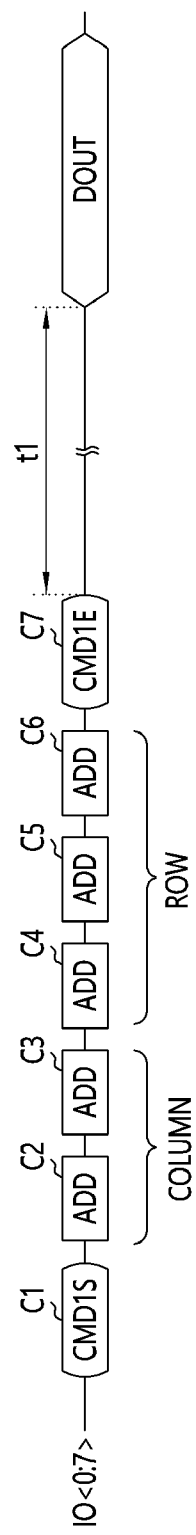
FIG. 2A is a timing diagram illustrating signals transmitted from a general semiconductor system during a data output operation.

FIG. 1 is a diagram illustrating the configuration of a semiconductor system 1 in accordance with an embodiment. In FIG. 1, the semiconductor system 1 may include a first semiconductor apparatus 110 and a second semiconductor apparatus 120. The first semiconductor apparatus 110 may provide various control signals used to operate the second semiconductor apparatus 120. The first semiconductor apparatus 110 may include various types of master devices. For example, the first semiconductor apparatus 110 may be a host device, such as a central processing unit (CPU), a graphics processing unit (GPU), a multi-media processor (MMP), a digital signal processor, an application processor (AP), and a memory controller. The second semiconductor apparatus 120 may be a slave device that performs various operations under the control of the first semiconductor apparatus 110 and may be, for example, a memory apparatus. The memory apparatus may include volatile memory and nonvolatile memory. Examples of volatile memory may include static RAM (SRAM), dynamic RAM (DRAM), and synchronous DRAM (SDRAM), and examples of nonvolatile memory may include read only memory (ROM), programmable ROM (PROM), and electrically erasable and programmable ROM (EEPROM), electrically programmable ROM (EPROM), flash memory, phase change RAM (PRAM), magnetic RAM (MRAM), resistive RAM (RRAM), ferroelectric RAM (FRAM), and the like.

The first semiconductor apparatus 110 may be connected to the second semiconductor apparatus 120 through a plurality of buses. The plurality of buses may be signal transmission paths, links, or channels for transmitting signals. The plurality of buses may include an input and output bus 101, a command control bus 102, an address control bus 103, and the like. The input and output bus 101 may be a bidirectional bus, and the command control bus 102 and the address control bus 103 may be unidirectional buses from the first semiconductor apparatus 110 to the second semiconductor apparatus 120. The first semiconductor apparatus 110 may provide input and output signals IO<0:7> to the second semiconductor apparatus 120 through the input and output bus 101 and may receive the input and output signals IO<0:7> from the second semiconductor apparatus 120 through the input and output bus 101. The input and output signals IO<0:7> transmitted from the first semiconductor apparatus 110 to the second semiconductor apparatus 120 may include a selection signal LS, a command signal CMD, an address signal ADD, and data DQ. The input and output signals IO<0:7> transmitted from the second semiconductor apparatus 120 to the first semiconductor apparatus 110 may include the data DQ. The command signal CMD may include command information specifying an operation performed by the second semiconductor apparatus 120. The address signal ADD may include address information for accessing a storage area of the second semiconductor apparatus 120. The first semiconductor apparatus 110 may transmit a command latch enable signal CLE to the second semiconductor apparatus 120 through the command control bus 102. The first semiconductor apparatus 110 may transmit an address latch enable signal ALE to the second semiconductor apparatus 120 through the address control bus 103. The command latch enable signal CLE and the address latch enable signal ALE may be signals capable of identifying which of the selection signal LS, the command signal CMD, and the address signal ADD, and the data DQ are included in the input and output signals IO<0:7>. The command latch enable signal CLE and the address latch enable signal ALE may be selectively enabled when the input and output signals IO<0:7> are transmitted. The second semiconductor apparatus 120 may receive the input and output signals IO<0:7> as one of the selection signal LS, the command signal CMD, and the address signal ADD, and the second semiconductor apparatus 120 may receive the data DQ according to enable states of the command latch enable signal CLE and the address latch enable signal ALE.

The plurality of buses may further include a write control bus 104, and the first semiconductor apparatus 110 may be connected to the second semiconductor apparatus 120 through the write control bus 104. The write control bus 104 may be a unidirectional bus from the first semiconductor apparatus 110 to the second semiconductor apparatus 120. The first semiconductor apparatus 110 may provide a write enable signal WE # to the second semiconductor apparatus 120 through the write control bus 104. The write enable signal WE # may be a signal defining a period during which the second semiconductor apparatus 120 receives the input and output signals IO<0:7> as valid signals. For example, during a period in which the write enable signal WE # is enabled, the second semiconductor apparatus 120 may sample, as valid signals, the input and output signals IO<0:7> transmitted from the first semiconductor apparatus 110 and may generate the selection signal LS, the command signal CMD, the address signal ADD, and the data DQ from the input and output signals IO<0:7>.

The first semiconductor apparatus 110 may include a command address generation circuit 111 and a data input and output circuit 112. The command address generation circuit 111 may generate the input and output signals IO<0:7> including the selection signal LS, the command signal CMD, and the address signal ADD based on a user's request REQ. The command address generation circuit 111 may transmit the input and output signals IO<0:7> including the selection signal LS, the command signal CMD, and the address signal ADD to the second semiconductor apparatus 120 through the input and output bus 101. The command address generation circuit 111 may transmit the input and output signals IO<0:7> to the second semiconductor apparatus 120 during at least one cycle according to the lengths and/or the total number of bits of the selection signal LS, the command signal CMD, and the address signal ADD. For example, the selection signal LS and the command signal CMD may be transmitted during one cycle, and the address signal ADD may be transmitted during a plurality of cycles. The command address generation circuit 111 may sequentially generate and transmit the selection signal LS, the command signal CMD, and the address signal ADD so that the second semiconductor apparatus 120 may perform at least one specific operation. For example, to instruct the second semiconductor apparatus 120 to perform a data input and output operation according to the request REQ, the command address generation circuit 111 may first transmit the input and output signals IO<0:7> including the selection signal LS, transmit the input and output signals IO<0:7> including the command signal CMD after transmitting the selection signal LS, and transmit the input and output signals IO<0:7> including the address signal ADD after transmitting the command signal CMD. For example, to instruct the second semiconductor apparatus 120 to perform the data output operation, the command address generation circuit 111 may sequentially transmit the selection signal LS, the command signal CMD, the address signal ADD, and the command signal CMD. To instruct the second semiconductor apparatus 120 to perform the data input operation, the command address generation circuit 111 may sequentially transmit the selection signal LS, the command signal CMD, and the address signal ADD. The data output operation may refer to an operation of transmitting the data DQ from the second semiconductor apparatus 120 to the first semiconductor apparatus 110, and the data input operation may refer to an operation of transmitting the data DQ from the first semiconductor apparatus 110 to the second semiconductor apparatus 120. In one example, the data output operation may be a random data output operation. The random data output operation may refer to an operation of changing a column address signal after a page read operation of the second semiconductor apparatus 120 is performed and transmitting data read from the second semiconductor apparatus 120 based on the changed column address signal to the first semiconductor apparatus 110 as the data DQ. The data input operation may be a random data input operation. The random data input operation may refer to an operation of transmitting the data DQ to be used for a page program operation of the second semiconductor apparatus 120 from the first semiconductor apparatus 110 to the second semiconductor apparatus 120 before the page program operation is performed.

The data input and output circuit 112 may be connected to the input and output bus 101 and may transmit and receive the input and output signals IO<0:7> through the input and output bus 101. During the data output operation, the data input and output circuit 112 may receive the input and output signals IO<0:7> including the data DQ from the second semiconductor apparatus 120 and may generate internal data DATA. During the data input operation, the data input and output circuit 112 may generate the data DQ from the internal data DATA and may transmit the input and output signals IO<0:7> including the data DQ to the second semiconductor apparatus 120. The data input and output circuit 112 may receive the data DQ from the second semiconductor apparatus 120 after the selection signal LS, the command signal CMD, and the address signal ADD may be transmitted by the command address generation circuit 111 during the data output operation. The data input and output circuit 112 may transmit the data DQ to the second semiconductor apparatus 120 after the selection signal LS, the command signal CMD, and the address signal ADD may be transmitted by the command address generation circuit 111 during the data input operation.

The second semiconductor apparatus 120 may include a plurality of dies. Each of the plurality of dies may perform a data input and output operation independently of the first semiconductor apparatus 110. For example, the second semiconductor apparatus 120 may include at least a first die 121 and a second die 122. The first die 121 and the second die 122 may have substantially the same configuration. Each of the first and second dies 121 and 122 may include a memory cell array. The memory cell array of the first die 121 may include a plurality of planes PL1, . . . , and PLk (k is an integer of 2 or more). Each of the plurality of planes PL1, . . . , and PLk may include a plurality of blocks B1, . . . , and Bm (m is an integer of 2 or more). One block may mean a unit that can be erased at one time. Each of the plurality of blocks B1, . . . , and Bm may include a plurality of pages P1, P2, . . . , and Pn (n is an integer of 3 or more). The page may mean a unit that can be programmed or read at one time. Each of the plurality of blocks B1, . . . , and Bm is composed of the plurality of pages P1, P2, . . . , and Pn and a plurality of strings (not illustrated), and a plurality of memory cells may be connected to points at which the plurality of pages P1, P2, . . . , and Pn intersect the plurality of strings. When a specific page among the plurality of pages P1, P2, . . . , and Pn and a specific string among the plurality of strings are selected, a memory cell connected between the selected page and the selected string may be accessed. Similar to the first die 121, the memory cell array of the second die 122 may include a plurality of planes PL1, . . . , PLk, and each of the plurality of planes PL1, . . . , and PLk may include a plurality of blocks B1, . . . , and Bm. Each of the plurality of blocks B1, . . . , and Bm may include a plurality of pages P1, P2, ..., and Pn. The first and second dies may each include a plurality of page buffers (not illustrated) connected to the plurality of strings in a one-to-one manner. The plurality of page buffers may perform an operation of programming data into a memory cell connected to the string or reading data stored in the memory cell connected to the string. The plurality of page buffers provided in each of the plurality of planes PL1, ..., and PLk may be independently activated.

The selection signal LS may include information for selecting one of the plurality of dies included in the second semiconductor apparatus 120. For example, to perform the data output operation or the data input operation on the first die 121, the selection signal LS may include information for selecting the first die 121. To perform the data output operation or the data input operation on the second die 122, the selection signal LS may include information for selecting the second die 122. The selection signal LS may include information for selecting one of the plurality of dies and information for selecting at least one of a plurality of planes PL1, ..., and PLk of the selected die. For example, to perform the data output operation or the data input operation on the second plane PL2 of the first die 121, the selection signal LS may include information for selecting the first die 121 and the second plane PL2 of the first die 121. To perform the data output operation or the data input operation on the first plane PL1 of the second die 122, the selection signal LS may include information for selecting the second die 122 and the first plane PL1 of the second die 122. Each of the first and second dies 121 and 122 may further include internal circuits for processing the input and output signals IO<0:7>, the command latch enable signal CLE, the address latch enable signal ALE, and the write enable signal WE # transmitted from the first semiconductor apparatus 110. The internal circuits will be described below.

FIG. 2A is a timing diagram illustrating signals transmitted in a general semiconductor system during a data output operation. In the general semiconductor system, the selection signal LS of FIG. 1 might not be used. Referring to FIG. 2A, in the general semiconductor system, a first semiconductor apparatus may sequentially provide command signals CMD1S and CMD1E and an address signal ADD so that a second semiconductor apparatus may perform a data output operation. The first semiconductor apparatus may provide the command signal CMD1S instructing the data output operation to the second semiconductor apparatus in a first cycle C1. The first cycle C1 may be a command cycle. The command signal CMD1S transmitted during the first cycle C1 may be a start command signal of a random data output command. After the command signal CMD1S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. After the address signal ADD is provided, the first semiconductor apparatus may provide the command signal CMD1E to the second semiconductor apparatus in the seventh cycle C7. The seventh cycle C7 may be a command cycle. The command signal CMD1E transmitted in the seventh cycle C7 may be an end command signal of the random data output command. After the command signal CMDE1 is provided, the second semiconductor apparatus may prepare for a data output operation by selecting a specific die and a specific plane based on the address signal ADD during a first time t1. The first time t1 may be tWHR2 defined in the joint electron device engineering council (JEDEC) STANDARD. The first time t1 may refer to a time required from the time point at which the end command signal of the random data output command is transmitted to the time point at which a specific die and a specific plane are selected, data is read from the selected plane based on the address signal ADD including the column address information COLUMN, and an input and output signal is generated from the read data. When the first time t1 elapses after the command signal CMD1E is transmitted, the second semiconductor apparatus may transmit data DOUT to the first semiconductor apparatus as the input and output signals IO<0:7>.

Figure 2B:
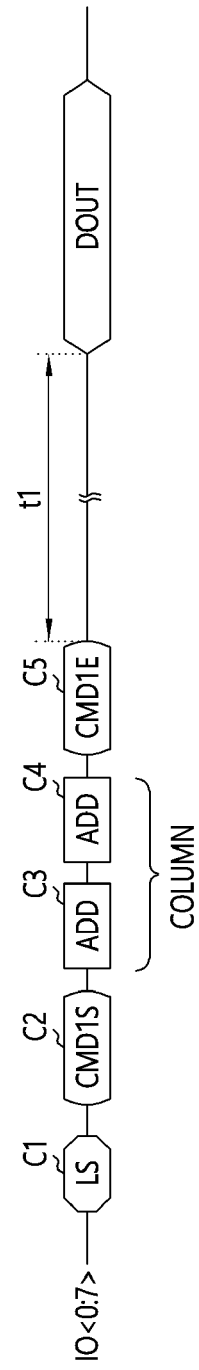
FIG. 2B is a timing diagram illustrating signals transmitted from the semiconductor system in accordance with an embodiment during a data output operation.

FIG. 2B is a timing diagram illustrating signals transmitted from the semiconductor system 100 in accordance with an embodiment during a data output operation. The semiconductor system 100 in accordance with an embodiment may have a logical unit number (LUN) selection cycle before a command cycle. Referring to FIG. 1 and FIG. 2B, in the semiconductor system 100, the first semiconductor apparatus 110 may sequentially provide the selection signal LS, the command signals CMD1S and CMD1E, and the address signal ADD so that the second semiconductor apparatus 120 may perform a data output operation. The first semiconductor apparatus 110 may transmit the selection signal LS to the second semiconductor apparatus 120 in a first cycle C1. The first cycle C1 may be a LUN selection cycle. The selection signal LS may include information for selecting a die and/or a plane that performs a data output operation corresponding to the command signals CMD1S and CMD1E transmitted in a command cycle to be described below. The selection signal LS may include row address information for selecting a specific die and specific plane of the second semiconductor apparatus 120. After the selection signal LS is provided, the first semiconductor apparatus 110 may provide the command signal CMD1S instructing the data output operation to the second semiconductor apparatus 120 in a second cycle C2. The second cycle C2 may be the command cycle. The command signal CMD1S transmitted during the second cycle C2 may be a start command signal of a random data output command. After the command signal CMD1S is provided, the first semiconductor apparatus 110 may provide the address signal ADD to the second semiconductor apparatus 120 in third and fourth cycles C3 and C4. The third and fourth cycles C3 and C4 may be address cycles. In the third and fourth cycles C3 and C4, the first semiconductor apparatus 110 may transmit the address signal ADD including column address information COLUMN for selecting a string of the second semiconductor apparatus 120. Because row address information for selecting a die and a plane of the second semiconductor apparatus 120 has been transmitted as the selection signal LS in the first cycle C1, the first semiconductor apparatus 110 might not transmit the address signal ADD including the row address information again. After the address signal ADD is provided, the first semiconductor apparatus 110 may provide the command signal CMD1E to the second semiconductor apparatus 120 in a fifth cycle C5. The fifth cycle C5 may be a command cycle. The command signal CMD1E transmitted in the fifth cycle C5 may be an end command signal of the random data output command. After the command signal CMD1E is provided, the second semiconductor apparatus 120 may prepare for the data output operation by selecting a specific die and a specific plane based on the selection signal LS during the first time t1 and reading data from the specific plane based on the address signal ADD including the column address information COLUMN. When the first time t1 elapses after the command signal CMD1E is transmitted, the second semiconductor apparatus 120 may transmit the data DOUT to the first semiconductor apparatus 110 as the input and output signals IO<0:7>. Because the semiconductor system 100 in accordance with an embodiment has the LUN selection cycle, it might not include the address cycle corresponding to the fourth to sixth cycles C4 to C6 in FIG. 2A. Accordingly, command overhead for the data output operation of the semiconductor system 100 can be reduced by a time corresponding to three address cycles compared to the general semiconductor system.

FIG. 3A is a timing diagram illustrating signals transmitted in the general semiconductor system during a data input operation. Referring to FIG. 3A, in the general semiconductor system, the first semiconductor apparatus may sequentially provide a command signal CMD2S and an address signal ADD so that the second semiconductor apparatus may perform a data input operation. The first semiconductor apparatus may provide the command signal CMD2S instructing the data input operation to the second semiconductor apparatus in a first cycle C1. The first cycle C1 may be a command cycle. The command signal CMD2S transmitted during the first cycle C1 may be a start command signal of a random data input command. After the command signal CMD2S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. After the address signal ADD is provided, the second semiconductor apparatus 120 may prepare for the data input operation by selecting a specific die and a specific plane based on the address signal ADD during a second time t2. The second time t2 may be tADL of the JEDEC STANDARD. The second time t2 may refer to a time required until a specific die and a specific plane are selected after the address signal ADD is transmitted and latch values of a plurality of page buffers connected to the selected plane may be initialized. When the second time t2 elapses after the address signal ADD is transmitted in the sixth cycle C6, the first semiconductor apparatus may transmit data DIN to the second semiconductor apparatus as the input and output signals IO<0:7>.

FIG. 3B is a timing diagram illustrating signals transmitted from the semiconductor system 100 in accordance with an embodiment during a data input operation. Referring to FIG. 1 and FIG. 3B, in the semiconductor system 100, the first semiconductor apparatus 110 may sequentially provide the selection signal LS, the command signal CMD2S, and the address signal ADD so that the second semiconductor apparatus 120 may perform a data input operation. The first semiconductor apparatus 110 may transmit the selection signal LS to the second semiconductor apparatus 120 in a first cycle C1. The first cycle C1 may be a logical unit number (LUN) selection cycle. The selection signal LS may include information for selecting a die and/or a plane that performs a data input operation corresponding to a command signal CMD2S transmitted in a command cycle to be described below. The selection signal LS may include row address information for selecting a specific die and specific plane of the second semiconductor apparatus 120. After the selection signal LS is provided, the first semiconductor apparatus 110 may provide a command signal CMD2S instructing the data input operation to the second semiconductor apparatus 120 in a second cycle C2. The second cycle C2 may be the command cycle. The command signal CMD2S transmitted during the second cycle C2 may be a start command signal of a random data input command. After the command signal CMD2S is provided, the first semiconductor apparatus 110 may provide the address signal ADD to the second semiconductor apparatus 120 in third to seventh cycles C3 to C7. The third to seventh cycles C3 to C7 may be address cycles. The address signal ADD transmitted in the third and fourth cycles C3 and C4 may include the column address information COLUMN, and the address signal ADD transmitted in the fifth to seventh cycles C5 to C7 may include the row address information ROW. The row address information ROW included in the address signal ADD transmitted in the fifth to seventh cycles C5 to C7 may be substantially the same as row address information included in the selection signal LS, and the fifth to seventh cycles C5 to C7 may be dummy. However, in the data input operation, because the first semiconductor apparatus 110 transmits no end command signal of the random data input command until the data DIN is transmitted to the second semiconductor apparatus 120, the semiconductor system 100 may still include the fifth to seventh cycles C5 to C7. Because the first semiconductor apparatus 110 has transmitted the selection signal LS for selecting the die and plane of the second semiconductor apparatus 120 in the first cycle C1, the second semiconductor apparatus 120 may prepare for a data input operation by selecting a specific die and a specific plane based on the selection signal LS during the second time t2 from the time point at which the command signal CMD2S is received in the second cycle C2. When the second time t2 elapses after the command signal CMD2S is transmitted, the first semiconductor apparatus 110 may transmit the data DIN to the second semiconductor apparatus 120 as the input and output signal. Because the semiconductor system 100, in accordance with an embodiment, has the LUN selection cycle, the second semiconductor apparatus 120 can prepare for the data input operation before the address cycle, and command overhead for the data input operation of the semiconductor system 100 may be reduced by a time corresponding to five address cycles compared to the general semiconductor system.

Figures 4, 5A:
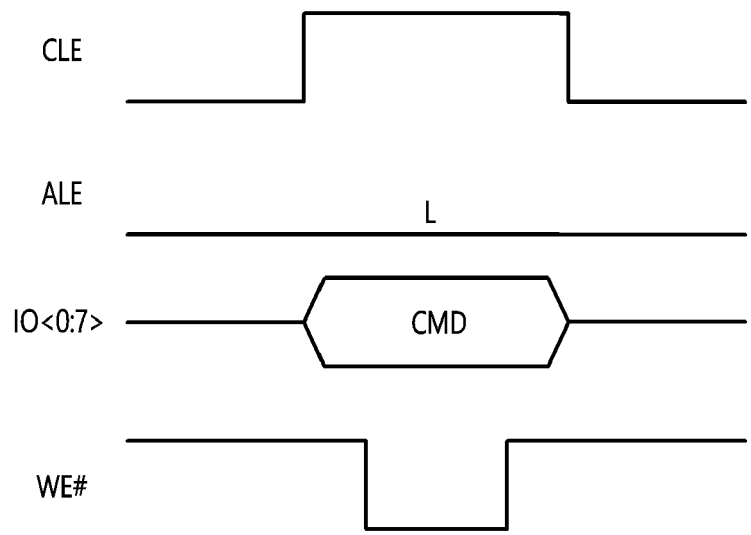
FIG. 4 is a table illustrating the configuration of a selection signal in accordance with an embodiment.
FIG. 5A to FIG. 5D are waveform diagrams illustrating signals transmitted from a semiconductor system in accordance with an embodiment.

FIG. 4 is a table showing the configuration of the selection signal LS in accordance with an embodiment. Referring to FIG. 1 and FIG. 4, the first semiconductor apparatus 110 may transmit the selection signal LS as the input and output signals IO<0:7> in a LUN selection cycle. When the input and output bus 101 includes 8 serial signal transmission lines, the selection signal LS may include 8 bits. First to fourth bits <0> to <3> of the selection signal LS may be used as die selection information LUN<0:3> for selecting a specific die from the plurality of dies of the second semiconductor apparatus 120. The first semiconductor apparatus 110 may individually select one of a maximum of 16 dies of the second semiconductor apparatus 120 by using the first to fourth bits <0:3> of the selection signal LS. Fifth to eighth bits <4> to <7> of the selection signal LS may be used as plane selection information Plane<0:3> for selecting a specific plane from the plurality of planes included in the plurality of dies of the second semiconductor apparatus 120. The first semiconductor apparatus 110 may individually select at least one of the maximum of 16 planes of each die by using the fifth to eighth bits <4:7> of the selection signal LS.

FIG. 5A to FIG. 5D are waveform diagrams illustrating signals transmitted from the semiconductor system 100 in accordance with an embodiment. Referring to FIG. 1 and FIG. 5A, the first semiconductor apparatus 110 may enable the command latch enable signal CLE and disable the address latch enable signal ALE when transmitting the input and output signals IO<0:7> including the command signal CMD. For example, the command latch enable signal CLE may be enabled to a high logic level and the address latch enable signal ALE may be disabled to a low logic level. During a period in which the command latch enable signal CLE is enabled, the first semiconductor apparatus 110 may transmit the input and output signals IO<0:7> including the command signal CMD. The first semiconductor apparatus 110 may transmit the write enable signal WE # that has a narrower pulse width than the command latch enable signal CLE and may be surrounded by a pulse of the command latch enable signal CLE. The write enable signal WE # may be enabled to a low logic level. The second semiconductor apparatus 120 may sense that the command latch enable signal CLE is enabled and the address latch enable signal ALE is disabled, and receive the input and output signals IO<0:7> as the command signal CMD. The second semiconductor apparatus 120 may sample the input and output signals IO<0:7> as the command signal CMD based on the write enable signal WE #.

Figure 5B:
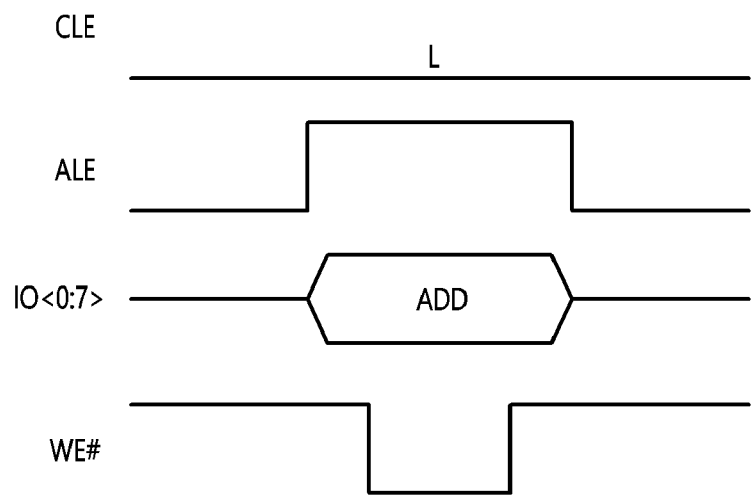

Referring to FIG. 5B, the first semiconductor apparatus 110 may disable the command latch enable signal CLE and enable the address latch enable signal ALE when transmitting the input and output signals IO<0:7> including the address signal ADD. For example, the command latch enable signal CLE may be disabled to a low logic level and the address latch enable signal ALE may be enabled to a high logic level. During a period in which the address latch enable signal ALE is enabled, the first semiconductor apparatus 110 may transmit the input and output signals IO<0:7> including the address signal ADD. The first semiconductor apparatus 110 may transmit the write enable signal WE # that has a narrower pulse width than the address latch enable signal ALE and may be surrounded by a pulse of the address latch enable signal ALE. The write enable signal WE # may be enabled to a low logic level. The second semiconductor apparatus 120 may sense that the address latch enable signal ALE is enabled and the command latch enable signal CLE is disabled, and receive the input and output signals IO<0:7> as the address signal ADD. The second semiconductor apparatus 120 may sample the input and output signals IO<0:7> as the address signal ADD based on the write enable signal WE #.

Figure 5C:
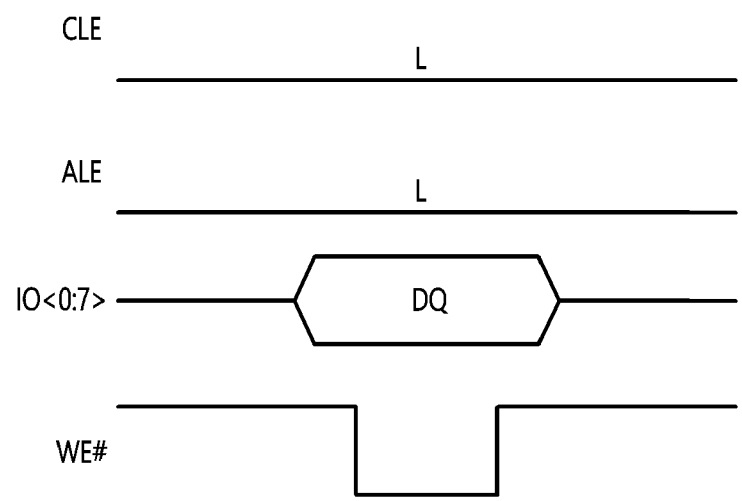

Referring to FIG. 5C, the first semiconductor apparatus 110 may disable both the command latch enable signal CLE and the address latch enable signal ALE when transmitting the input and output signals IO<0:7> including the data DQ. The first semiconductor apparatus 110 may transmit the input and output signals IO<0:7>, and transmit the write enable signal WE # enabled to a low logic level during a period in which the input and output signals IO<0:7> are transmitted. The second semiconductor apparatus 120 may sense that the command latch enable signal CLE and the address latch enable signal ALE are disabled, and receive the input and output signals IO<0:7> as the data DQ. The second semiconductor apparatus 120 may sample the input and output signals IO<0:7> as the data DQ based on the write enable signal WE #.

Figure 5D:
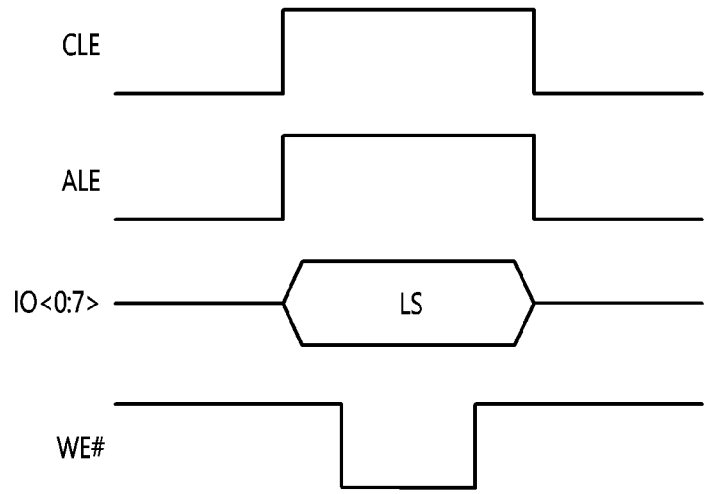

Referring to FIG. 5D, the first semiconductor apparatus 110 may enable both the command latch enable signal CLE and the address latch enable signal ALE when transmitting the input and output signals IO<0:7> including the selection signal LS. During a period in which both the command latch enable signal CLE and the address latch enable signal ALE are enabled, the first semiconductor apparatus 110 may transmit the input and output signals IO<0:7> including the selection signal LS. The first semiconductor apparatus 110 may transmit the write enable signal WE # that has a narrower pulse width than the command latch enable signal CLE and the address latch enable signal ALE and may be surrounded by pulses of the command latch enable signal CLE and the address latch enable signal ALE. The second semiconductor apparatus 120 may sense that both the command latch enable signal CLE and the address latch enable signal ALE are enabled, and receive the input and output signals IO<0:7> as the selection signal LS. The second semiconductor apparatus 120 may sample the input and output signals IO<0:7> as the selection signal LS based on the write enable signal WE #.

Figure 6:
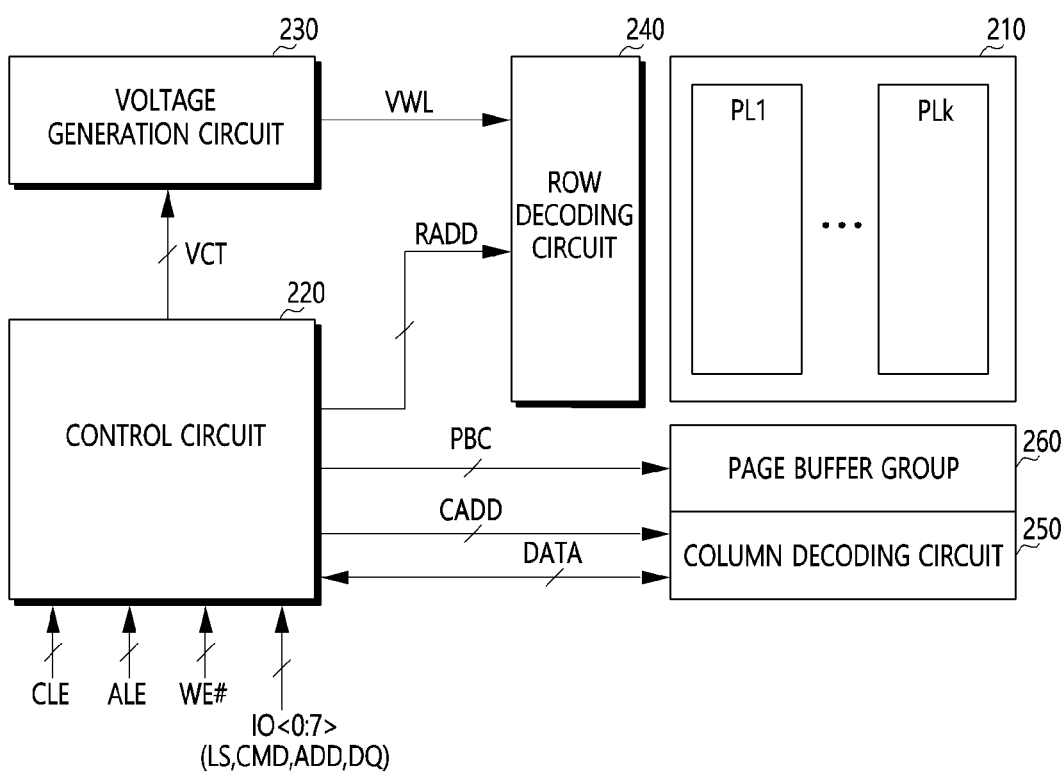
FIG. 6 is a diagram illustrating the configuration of a semiconductor apparatus in accordance with an embodiment.

FIG. 6 is a diagram illustrating the configuration of a semiconductor apparatus 200 in accordance with an embodiment. The semiconductor apparatus 200 may be applied as at least one of the first and second dies 121 and 122 of the second semiconductor apparatus 120 of FIG. 1. The semiconductor apparatus 200 may include a memory cell array 210, a control circuit 220, a voltage generation circuit 230, a row decoding circuit 240, a column decoding circuit 250, and a page buffer group 260. The memory cell array 210 may include a plurality of planes PL1, . . . , and PLk. The memory cell array 210 may be substantially the same as the memory cell arrays of the first and second dies 121 and 122 illustrated in FIG. 1, and redundant descriptions of substantially the same components will be omitted.

The control circuit 220 may be connected to the first semiconductor apparatus 110 through the plurality of buses 101 to 104 of FIG. 1, and may receive the input and output signals IO<0:7>, the command latch enable signal CLE, the address latch enable signal ALE, and the write enable signal WE # from the first semiconductor apparatus 110. The input and output signals IO<0:7> may include a selection signal LS, a command signal CMD, an address signal ADD, and data DQ. The control circuit 220 may also transmit the input and output signals IO<0:7> to the first semiconductor apparatus 110. The control circuit 220 may receive the input and output signals IO<0:7> including the data DQ from the first semiconductor apparatus 110 in a data input operation, and transmit the input and output signals IO<0:7> including the data DQ to the first semiconductor apparatus 110 in a data output operation. The control circuit 220 may receive the input and output signals IO<0:7> as one of the selection signal LS, the command signal CMD, the address signal ADD, and the data DQ based on the command latch enable signal CLE, the address latch enable signal ALE, and the write enable signal WE #. For example, as illustrated in FIG. 5A to FIG. 5D, the control circuit 220 may receive the input and output signals IO<0:7> as the selection signal LS, the command signal CMD, the address signal ADD, and the data DQ according to whether the command latch enable signal CLE and the address latch enable signal ALE are enabled. The control circuit 220 may include an interface circuit that receives the input and output signals IO<0:7>, the command latch enable signal CLE, the address latch enable signal ALE, and the write enable signal WE # transmitted from the first semiconductor apparatus 110, and transmits the input and output signals IO<0:7> to the first semiconductor apparatus 110.

The control circuit 220 may receive the selection signal LS, the command signal CMD, the address signal ADD, and the data DQ, and generate a plurality of control signals for controlling internal circuits of the semiconductor apparatus 200 so that the semiconductor apparatus 200 may perform various operations. The control circuit 220 may generate a voltage control signal VCT, a row address signal RADD, a column address signal CADD, and a page buffer control signal PBC based on the command signal CMD, the address signal ADD, and the selection signal LS. The control circuit 220 may generate the voltage control signal VCT and the page buffer control signal PBC based on the command signal CMD, provide the voltage control signal VCT to the voltage generation circuit 230, and provide the page buffer control signal PBC to the page buffer group 260. The control circuit 220 may change a value of the voltage control signal VCT so that the voltage generation circuit 230 may generate a plurality of voltages having various voltage levels according to the type of the command signal CMD. The page buffer control signal PBC may include a plurality of different types of control signals to control an operation of the page buffer group 260. The control circuit 220 may generate the row address signal RADD and the column address signal CADD based on the address signal ADD. The control circuit 220 may provide the row address signal RADD to the row decoding circuit 240, and provide the column address signal CADD to the column decoding circuit 250. The control circuit 220 may generate the page buffer control signal PBC based on the selection signal LS. The control circuit 220 may generate internal data DATA from the data DQ, and provide the internal data DATA to the column decoding circuit 250 and the page buffer group 260. Furthermore, the control circuit may receive the internal data DATA from the page buffer group 260 and the column decoding circuit 250, and generate the data DQ from the internal data DATA. The control circuit 220 may include a serializer-deserializer (SERDES) that generates the internal data DATA by parallelizing the data DQ and generates the data DQ by serializing the internal data DATA.

The voltage generation circuit 230 may receive the voltage control signal VCT from the control circuit 220, and generate a low voltage VWL. The low voltage VWL may have various voltage levels according to a value of the voltage control signal VCT. For example, the low voltage VWL may include a plurality of program voltages, a plurality of verify voltages, a plurality of read voltages, an erase voltage, or a plurality of pass voltages. The plurality of program voltages, the plurality of verify voltages, the plurality of read voltages, or the plurality of pass voltages may be applied to a selected page through the row decoding circuit 240. The erase voltage may be applied to a well region of a selected block through the row decoding circuit 240.

The row decoding circuit 240 may receive the row address signal RADD from the control circuit 220, and select a specific page of the memory cell array 210 based on the row address signal RADD. The row decoding circuit 240 may decode the row address signal RADD, and select at least one page according to the decoded result. The low decoding circuit 240 may receive the low voltage VWL from the voltage generation circuit 230. The row decoding circuit 240 may apply the low voltage VWL to the selected page.

The column decoding circuit 250 may receive the column address signal CADD from the control circuit 220, and select a specific string of the memory cell array 210 based on the column address signal CADD. The column decoding circuit 250 may decode the column address signal CADD, and select at least one string according to the decoded result. The column decoding circuit 250 may receive the internal data DATA from the control circuit 220. The column decoding circuit 250 may provide the internal data DATA to the page buffer group 260. When the specific page is selected by the row decoding circuit 240 and the specific string is selected by the column decoding circuit 250, a target memory cell connected to the selected page and the selected string may be accessed.

The page buffer group 260 may receive the page buffer control signal PBC from the control circuit 220, and may be connected to the selected string by the column decoding circuit 250. The page buffer group 260 may include the same number of page buffers as a plurality of strings provided in the memory cell array 210, and the plurality of page buffers may be connected to the plurality of strings in a one-to-one manner. The plurality of page buffers may set up voltage levels of the plurality of strings based on the page buffer control signal PBC. During a program operation, the plurality of page buffers may temporarily store the internal data DATA provided from the column decoding circuit 250. Furthermore, the plurality of page buffers may temporarily store, in the selected string, a program verification result regarding whether a program has been successfully executed. During a read operation, the plurality of page buffers may temporarily store data output from the selected string. The page buffer group 260 may be selectively activated based on the page buffer control signal PBC generated based on the selection signal LS. For example, a plurality of page buffers provided in each of the plurality of planes PL1, . . . , and PLk may be independently activated based on the page buffer control signal PBC.

When the data output operation is performed, the page buffer group 260 may read data stored in the memory cell array 210 from a string selected based on the page buffer control signal PBC, and output the read data as the internal data DATA. The control circuit 220 may parallelize the data DATA and generate the input and output signals IO<0:7> including the data DQ. When the data input operation is performed, the page buffer group 260 may initialize latch values of latch circuits included in the plurality of page buffers, based on the page buffer control signal PBC.

Figure 7:
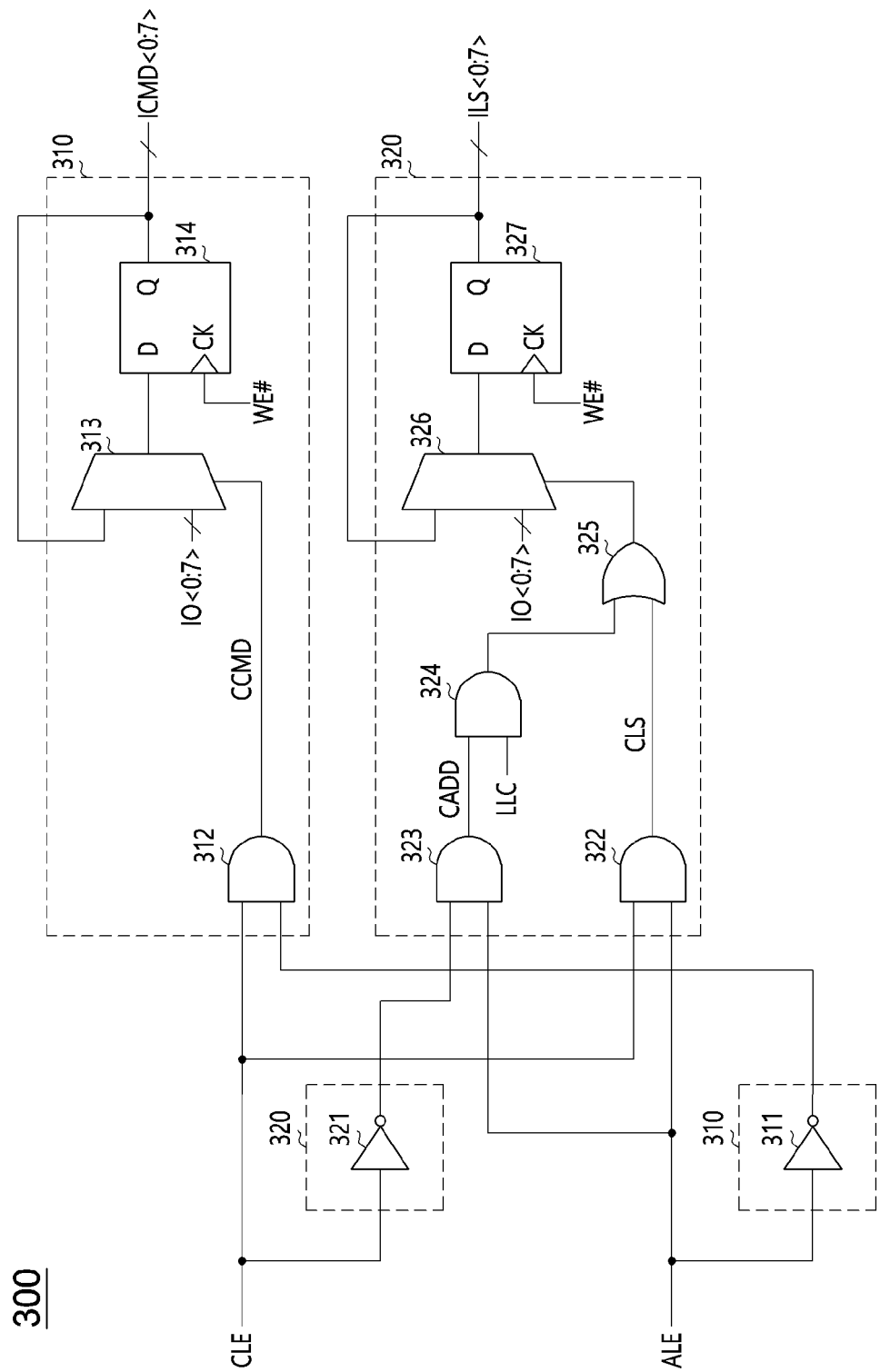
FIG. 7 is a diagram illustrating the configuration of a control circuit in accordance with an embodiment.

FIG. 7 is a diagram illustrating the configuration of a control circuit 300 in accordance with an embodiment. The control circuit 300 may be applied as at least a part of the control circuit 220 of FIG. 6. Referring to FIG. 7, the control circuit 300 may generate the command signal CMD and the selection signal LS based on the input and output signals IO<0:7>, the command latch enable signal CLE, and the address latch enable signal ALE. The control circuit 300 may include at least a command generation circuit 310 and a selection signal generation circuit 320. The command generation circuit 310 may generate internal command signals ICMD<0:7> based on the command latch enable signal CLE, the address latch enable signal ALE, and the input and output signals IO<0:7>. When the command latch enable signal CLE is enabled and the address latch enable signal ALE is disabled, the command generation circuit 310 may generate the internal command signals ICMD<0:7> from the input and output signals IO<0:7>. The command generation circuit 310 may change values of the internal command signals ICMD<0:7> according to the input and output signals IO<0:7>. When the command latch enable signal CLE is disabled, the command generation circuit 310 may maintain the values of the internal command signals ICMD<0:7>. The command generation circuit 310 may further receive the write enable signal WE #. The command generation circuit 310 may update the values of the internal command signals ICMD<0:7> based on the write enable signal WE #.

The selection signal generation circuit 320 may generate the internal selection signals ILS<0:7> based on the command latch enable signal CLE, the address latch enable signal ALE, and the input and output signals IO<0:7>. When both the command latch enable signal CLE and the address latch enable signal ALE are enabled, the selection signal generation circuit 320 may generate the internal selection signals ILS<0:7> from the input and output signals IO<0:7>. The selection signal generation circuit 320 may change values of the internal selection signals ILS<0:7> according to the input and output signals IO<0:7>. When one of the command latch enable signal CLE and the address latch enable signal ALE is disabled, the selection signal generation circuit 320 may maintain the values of the internal selection signals ILS<0:7>. The selection signal generation circuit 320 may further receive the write enable signal WE #. The selection signal generation circuit 320 may update the values of the internal selection signals ILS<0:7> based on the write enable signal WE #. The selection signal generation circuit 320 may further receive a selection condition signal LLC. The selection signal generation circuit 320 may additionally change the values of the internal selection signals ILS<0:7> based on the selection condition signal LLC. When the address latch enable signal ALE and the selection condition signal LLC are enabled regardless of the command latch enable signal CLE, the selection signal generation circuit 320 may update the values of the internal selection signals ILS<0:7> based on the input and output signal IO<0:7>.

The command generation circuit 310 may include a first inverter 311, a first logic gate 312, a first multiplexer 313, and a first flip-flop 314. The first inverter 311 may receive the address latch enable signal ALE, and invert and drive the address latch enable signal ALE. A first input terminal of the first logic gate 312 may receive the command latch enable signal CLE, and a second input terminal of the first logic gate 312 may receive an output signal of the first inverter 311. A command cycle signal CCMD may be generated from an output terminal of the first logic gate 312. When the command latch enable signal CLE is enabled to a high logic level and the address latch enable signal ALE is disabled to a low logic level, the first logic gate 312 may generate the command cycle signal CCMD having a high logic level. When the command latch enable signal CLE is disabled to a low logic level or the address latch enable signal ALE is enabled to a high logic level, the first logic gate 312 may generate the command cycle signal CCMD having a low logic level. The first logic gate 312 may be an AND gate. The first multiplexer 313 may receive the input and output signals IO<0:7>, the internal command signals ICMD<0:7>, and the command cycle signal CCMD. The first multiplexer 313 may output one of the internal command signals ICMD<0:7> and the input and output signals IO<0:7> based on the command cycle signal CCMD. When the command cycle signal CCMD has a high logic level, the first multiplexer 313 may output the input and output signals IO<0:7>. When the command cycle signal CCMD has a low logic level, the first multiplexer 313 may output the internal command signals ICMD<0:7>. An input terminal D of the first flip-flop 314 may receive the output signal of the first multiplexer 313, a clock terminal CK of the first flip-flop 314 may receive the write enable signal WE #, and the internal command signals ICMD<0:7> may be output from an output terminal Q of the first flip-flop 314. When the write enable signal WE # is enabled, the first flip-flop 314 may output the output signal of the first multiplexer 313 as the internal command signals ICMD<0:7>. The first flip-flop 314 may feed back the internal command signals ICMD<0:7> to the first multiplexer 313. When the command cycle signal CCMD is at a high logic level, the first multiplexer 313 may output the input and output signals IO<0:7> and the first flip-flop 314 may change the values of the internal command signals ICMD<0:7> according to the input and output signals IO<0:7. When the command cycle signal CCMD is at a low logic level, because the first multiplexer 313 outputs the internal command signals ICMD<0:7> to the first flip-flop 314, and the first flip-flop 314 outputs the internal command signals ICMD<0:7> again as the internal command signals ICMD<0:7>, the values of the internal command signals ICMD<0:7> may be maintained.

The selection signal generation circuit 320 may include a second inverter 321, a second logic gate 322, a third logic gate 323, a fourth logic gate 324, a fifth logic gate 325, a second multiplexer 326, and a second flip-flop 327. The first inverter 321 may receive the command latch enable signal CLE, and invert and drive the command latch enable signal CLE. A first input terminal of the second logic gate 322 may receive the command latch enable signal CLE, and a second input terminal of the second logic gate 322 may receive the address latch enable signal ALE. A LUN selection cycle signal CLS may be generated from an output terminal of the second logic gate 322. When both the command latch enable signal CLE and the address latch enable signal ALE are enabled to high logic levels, the second logic gate 322 may generate the LUN selection cycle signal CLS having a high logic level. When at least one of the command latch enable signal CLE and the address latch enable signal ALE is disabled to a low logic level, the second logic gate 322 may generate the LUN selection cycle signal CLS having a low logic level. The second logic gate 322 may be an AND gate. A first input terminal of the third logic gate 323 may receive an output signal of the second inverter 321, and a second input terminal of the third logic gate 323 may receive the address latch enable signal ALE. An address cycle signal CADD may be generated from an output terminal of the third logic gate 323. When the command latch enable signal CLE is disabled to a low logic level and the address latch enable signal ALE is enabled to a high logic level, the third logic gate 323 may generate the address cycle signal CADD having a high logic level. The third logic gate 323 may be an AND gate. When the command latch enable signal CLE is enabled to a high logic level or the address latch enable signal ALE is disabled to a low logic level, the fourth logic gate 324 may generate the address cycle signal CADD having a low logic level. The third logic gate 323 may be an AND gate. A first input terminal of the fourth logic gate 324 may receive the address cycle signal CADD, and a second input terminal of the fourth logic gate 324 may receive the selection condition signal LLC. When both the address cycle signal CADD and the selection condition signal LLC are enabled to high logic levels, the fourth logic gate 324 may generate an output signal having a high logic level. When at least one of the address cycle signal CADD and the selection condition signal LLC is disabled to a low logic level, the fourth logic gate 324 may generate an output signal having a low logic level. The fourth logic gate 324 may be an AND gate. The fifth logic gate 325 may receive the output signal of the fourth logic gate 324 and the LUN selection cycle signal CLS. When at least one of the output signal of the fourth logic gate 324 and the LUN selection cycle signal CLS is at a high logic level, the fifth logic gate 325 may generate an output signal having a high logic level. When both the output signal of the fourth logic gate 324 and the LUN selection cycle signal CLS are at low logic levels, the fifth logic gate 325 may generate an output signal having a low logic level. The fifth logic gate 325 may be an OR gate.

The second multiplexer 326 may receive the input and output signals IO<0:7>, the internal selection signals ILS<0:7>, and the output signal of the fifth logic gate 325. The second multiplexer 326 may output one of the internal selection signals ILS<0:7> and the input and output signals IO<0:7> based on the output signal of the fifth logic gate 325. When the output signal of the fifth logic gate 325 has a high logic level, the second multiplexer 326 may output the input and output signals IO<0:7>. When the output signal of the fifth logic gate 325 has a low logic level, the second multiplexer 326 may output the internal selection signals ILS<0:7>. An input terminal D of the second flip-flop 327 may receive the output signal of the second multiplexer 326, a clock terminal CK of the second flip-flop 327 may receive the write enable signal WE #, and the internal selection signals ILS<0:7> may be output from an output terminal Q of the second flip-flop 327. The second flip-flop 327 may feed back the internal selection signals ILS<0:7> to the second multiplexer 326. When the write enable signal WE # is enabled, the second flip-flop 327 may output the output signal of the second multiplexer 326 as the internal selection signals ILS<0:7>. When the output signal of the fifth logic gate 325 is at a high logic level, the second multiplexer 326 may output the input and output signals IO<0:7> and the second flip-flop 327 may output the output signal of the second multiplexer 326 as the internal selection signals ILS<0:7>, thereby changing the values of the internal selection signals ILS<0:7> according to the input and output signal IO<0:7>. When the output signal of the fifth logic gate 325 is at a low logic level, the second multiplexer 326 may output the internal selection signals ILS<0:7>, and the second flip-flop 327 may output the internal selection signals ILS<0:7> again as the internal selection signals ILS<0:7>, thereby maintaining the values of the internal selection signals ILS<0:7>.

Figure 8:
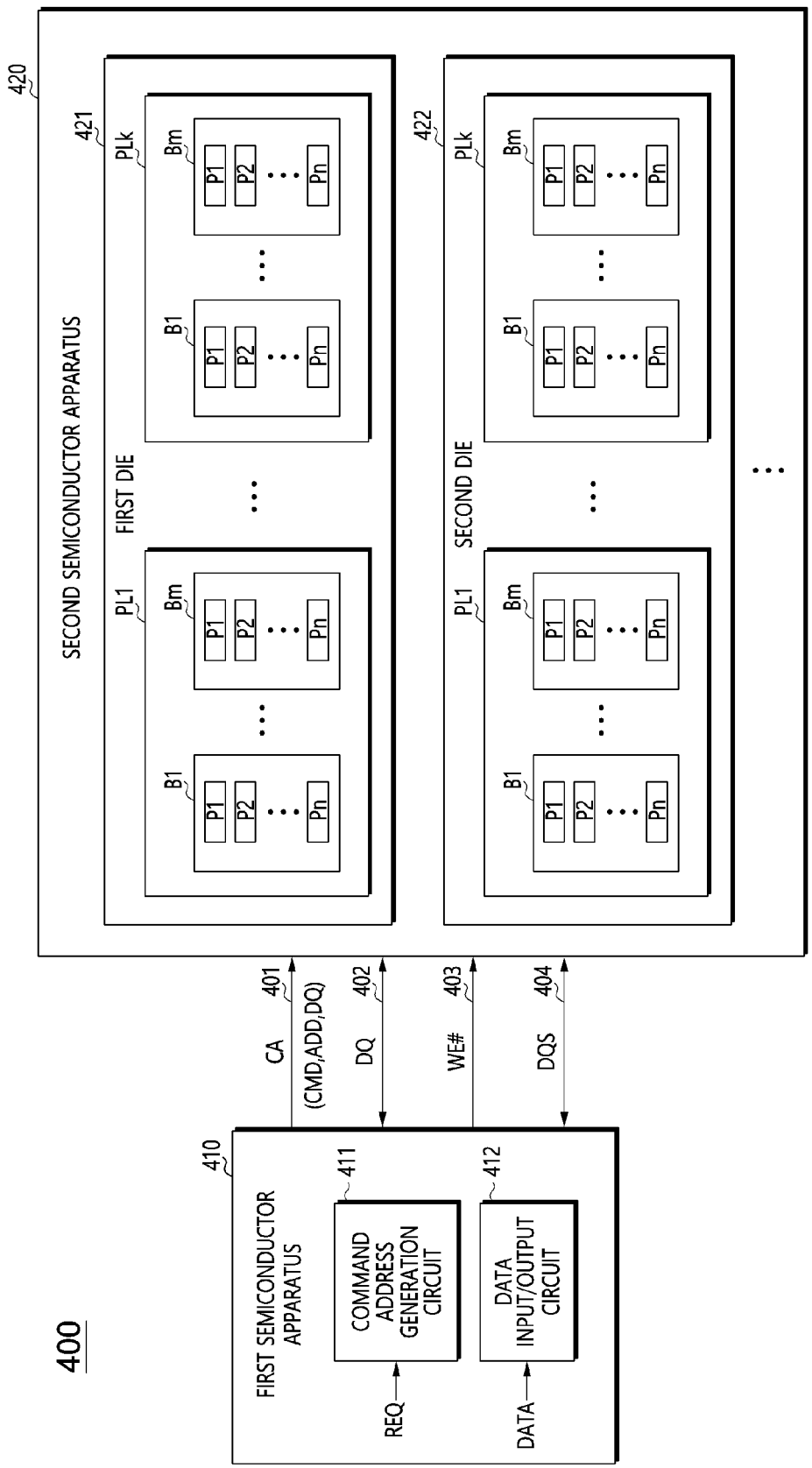
FIG. 8 is a diagram illustrating the configuration of a semiconductor system in accordance with an embodiment.

FIG. 8 is a diagram illustrating the configuration of a semiconductor system 400 in accordance with an embodiment. The semiconductor system 400 may include a first semiconductor apparatus 410 and a second semiconductor apparatus 420. The first semiconductor apparatus 410 may include a command address generation circuit 411 and a data input and output circuit 412. The second semiconductor apparatus 420 may include a plurality of dies. For example, the second semiconductor apparatus 420 may include a first die 421 and a second die 422. The first die 421 may include a memory cell array, and the memory cell array may include a plurality of planes PL1, . . . , and PLk (k is an integer of 2 or more). Each of the plurality of planes PL1, . . . , and PLk may include a plurality of blocks B1, . . . , and Bm (m is an integer of 2 or more), and each of the plurality of blocks B1, . . . , and Bm may include a plurality of pages P1, P2, . . . , and Pn (n is an integer of 3 or more). The second die 422 may include a memory cell array, and the memory cell array may include a plurality of planes PL1, . . . , and PLk. Each of the plurality of planes PL1, . . . , and PLk may include a plurality of blocks B1, . . . , and Bm, and each of the plurality of blocks B1, . . . , and Bm may include a plurality of pages P1, P2, . . . , and Pn. The first and second semiconductor apparatuses 410 and 420 may have substantially the same configuration as the first and second semiconductor apparatuses 110 and 120, illustrated in FIG. 1. Redundant descriptions of substantially the same components will be omitted.

The first semiconductor apparatus 410 may be connected to the second semiconductor apparatus 420 through a plurality of buses. The plurality of buses may include a command address bus 401, a data bus 402, a write control bus 403, and a data strobe bus 404. The command address bus 401 and the write control bus 403 may be unidirectional buses from the first semiconductor apparatus 410 to the second semiconductor apparatus 420. The data bus 402 and the data strobe bus 404 may be bi-directional buses. The first semiconductor apparatus 410 may be connected to the second semiconductor apparatus 420 through the command address bus 401 and may provide a command address signal CA to the second semiconductor apparatus 420 through the command address bus 401. The command address signal CA may include a command signal CMD, an address signal ADD, and a selection signal LS. The command address generation circuit 411 may be connected to the command address bus 401 and may transmit the command address signal CA generated according to a user's request REQ to the semiconductor apparatus 420 through the command address bus 401. The first semiconductor apparatus 410 may be connected to the second semiconductor apparatus 420 through the data bus 402 and may provide the data DQ to the second semiconductor apparatus 420 through the data bus 402 or receive the data DQ from the second semiconductor apparatus 420 through the data bus 402. In the semiconductor system 100 of FIG. 1, the command signal CMD, the address signal ADD, the selection signal LS, and the data DQ may be all transmitted through the input and output bus 101. However, in the semiconductor system 400, a bus through which the command signal CMD, the address signal ADD, and the selection signal LS are transmitted may be separated from a bus through which the data DQ is transmitted. The first semiconductor apparatus 410 may be connected to the second semiconductor apparatus 420 through the write control bus 403 and may provide a write enable signal WE # to the second semiconductor apparatus 420 through the write control bus 403. The write enable signal WE # may be a command clock signal used to transmit the command address signal CA. The first semiconductor apparatus 410 may transmit the command address signal CA to the second semiconductor apparatus 420 in synchronization with the write enable signal WE #. The first semiconductor apparatus 410 may be connected to the second semiconductor apparatus 420 through the data strobe bus 404 and may transmit a data strobe signal DQS to the second semiconductor apparatus 420 through the data strobe bus 404 or receive the data strobe signal DQS from the second semiconductor apparatus 420 through the data strobe bus 404. The data strobe signal DQS may be a signal synchronized with the data DQ and may be a clock signal that toggles while the data DQ is transmitted. When the data DQ is provided to the second semiconductor apparatus 420, the first semiconductor apparatus 410 may provide the second semiconductor apparatus 420 with the data strobe signal DQS synchronized with the data DQ. When the data DQ is provided to the first semiconductor apparatus 410, the second semiconductor apparatus 420 may provide the first semiconductor apparatus 410 with the data strobe signal DQS synchronized with the data DQ.

Figure 9A:
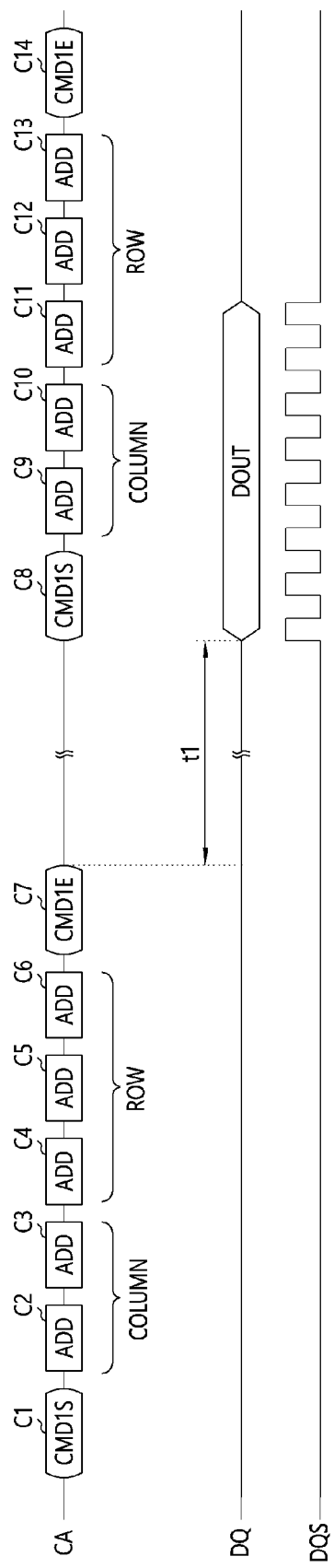
FIG. 9A is a timing diagram illustrating signals transmitted from a general semiconductor system during a data output operation.

FIG. 9A is a timing diagram illustrating signals transmitted in a general semiconductor system during a data output operation. Referring to FIG. 9A, in the general semiconductor system, a first semiconductor apparatus may sequentially provide command signals CMD1S and CMD1E and an address signal ADD so that a second semiconductor apparatus may perform a data output operation. The first semiconductor apparatus may provide the command signal CMD1S instructing the data output operation to the second semiconductor apparatus in a first cycle C1. The first cycle C1 may be a command cycle. The command signal CMD1S transmitted during the first cycle C1 may be a start command signal of a random data output command. After the command signal CMD1S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. After the address signal ADD is provided, the first semiconductor apparatus may provide the command signal CMD1E to the second semiconductor apparatus in a seventh cycle C7. The seventh cycle C7 may be a command cycle. The command signal CMD1E transmitted in the seventh cycle C7 may be an end command signal of the random data output command. During the first to seventh cycles C1 to C7, the first semiconductor apparatus may transmit the command signals CMD1S and CMD1E and the address signal ADD to the second semiconductor apparatus through the command address bus 401 of FIG. 8. After the command signal CMD1E is provided in the seventh cycle C7, the second semiconductor apparatus may prepare for a data output operation by selecting a specific die and a specific plane based on the address signal ADD including the row address information ROW during a first time t1 and reading data from the selected plane based on the address signal ADD including the column address information COLUMN. The first time t1 may be tWHR2 of the JEDEC STANDARD. When the first time t1 elapses after the command signal CMD1S is transmitted, the second semiconductor apparatus may transmit data DOUT and a data strobe signal DQS synchronized with the data DOUT to the first semiconductor apparatus through the data bus 402 and the data strobe bus 404 in FIG. 8.

Another data output operation may be performed in parallel before or when the second semiconductor apparatus transmits the data DOUT to the first semiconductor apparatus. For example, before or when the data DOUT is transmitted from the first die to the first semiconductor apparatus, in a case in which the first semiconductor apparatus has instructed the data output operation of the first die of the second semiconductor apparatus in the first to seventh cycles C1 to C7, the first semiconductor apparatus may instruct a data output operation of the second die of the second semiconductor apparatus. The first semiconductor apparatus may transmit the command signal CMD1S corresponding to the start command signal of the random data output command to the second semiconductor apparatus in an eighth cycle C8, transmit the address signal ADD to the second semiconductor apparatus in ninth to thirteenth cycles C9 to C13, and transmit the command signal CMD1E corresponding to the end command signal of the random data output command to the second semiconductor apparatus in a fourteenth cycle C14. The eighth to fourteenth cycles C8 to C14 may partially or completely overlap a period during which the second semiconductor apparatus transmits the data DOUT to the first semiconductor apparatus. In the general semiconductor system, before or when the data DOUT is transmitted from the first die of the second semiconductor apparatus, in a case in which the command signals CMD1S and CMD1E and the address signal ADD are transmitted to the second die, the value of a column address signal of the first die may be changed by the address signal ADD transmitted in the eighth and ninth cycles C8 and C9. Accordingly, when the data output operations of the first and second dies are performed in parallel, each of the first and second dies need to include a complicated internal circuit so that a column address signal of a die that performs a first data output operation is not contaminated by an address signal ADD provided to a die that performs a second data output operation.

Figure 9B:
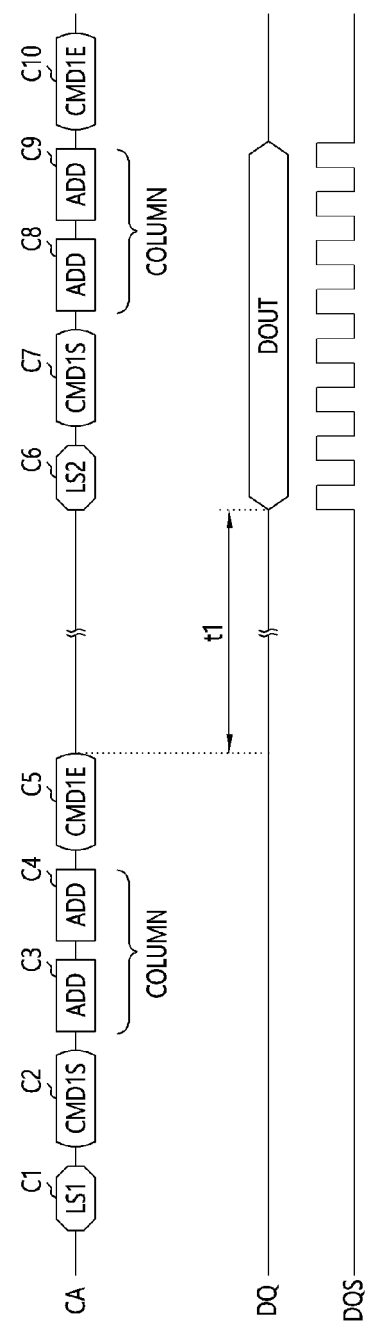
FIG. 9B is a timing diagram illustrating signals transmitted from a semiconductor system in accordance with an embodiment during a data output operation.

FIG. 9B is a timing diagram illustrating signals transmitted from the semiconductor system 400 in accordance with an embodiment during a data output operation. The semiconductor system 400 in accordance with an embodiment may have a LUN selection cycle before a command cycle. Referring to FIG. 8 and FIG. 9B, in the semiconductor system 400, the first semiconductor apparatus 410 may sequentially provide a selection signal LS1, the command signals CMD1S and CMD1E, and the address signal ADD so that the second semiconductor apparatus 420 may perform a data output operation. In a first cycle C1, the first semiconductor apparatus 410 may transmit the selection signal LS1 to the second semiconductor apparatus 420. The first cycle C1 may be a logical unit number (LUN) selection cycle. The selection signal LS1 may include information for selecting a die and/or a plane that performs a data output operation corresponding to the command signals CMD1S and CMD1E transmitted in a command cycle to be described below. The selection signal LS1 may include row address information for selecting a specific die and specific plane of the second semiconductor apparatus 420. For example, the selection signal LS1 may include row address information for selecting a specific plane of the first die of the second semiconductor apparatus 420. After the selection signal LS1 is provided, the first semiconductor apparatus 410 may provide a command signal CMD1S instructing the data output operation to the second semiconductor apparatus 420 in a second cycle C2. The second cycle C2 may be the command cycle. The command signal CMD1S transmitted during the second cycle C2 may be a start command signal of a random data output command. After the command signal CMD1S is provided, the first semiconductor apparatus 410 may provide the address signal ADD to the second semiconductor apparatus 420 in third and fourth cycles C3 and C4. The third and fourth cycles C3 and C4 may be address cycles. The first semiconductor apparatus 410 may transmit the address signal ADD including column address information COLUMN for selecting a string of the second semiconductor apparatus in the third and fourth cycles C3 and C4. Because the row address information for selecting a die and a plane of the second semiconductor apparatus 420 has been transmitted as the selection signal LS1 in the first cycle C1, the first semiconductor apparatus 410 may transmit again no address signal ADD corresponding to the address signal ADD transmitted in the fourth to sixth cycles C4 to C6 in FIG. 9A. After the address signal ADD is provided, the first semiconductor apparatus 410 may provide the command signal CMD1E to the second semiconductor apparatus 420 in the fifth cycle C5. The fifth cycle C5 may be a command cycle. The command signal CMD1E transmitted in the fifth cycle C5 may be an end command signal of the random data output command. The first semiconductor apparatus 410 may transmit the selection signal LS1, the command signals CMD1S and CMD1E, and the address signal ADD through the command address bus 401 in FIG. 8 in the first to fifth cycles C1 to C5. After the command signal CMD1E is provided, the second semiconductor apparatus 420 may prepare for a data output operation by selecting a specific die and a specific plane based on the selection signal LS1 during the first time t1 and reading data from the selected plane based on the address signal ADD including the column address information COLUMN. When the first time t1 elapses, the second semiconductor apparatus 420 may transmit the data DOUT and the data strobe signal DQS synchronized with the data DOUT to the first semiconductor apparatus 410 through the data bus 402 and the data strobe bus 404 in FIG. 8. Because the semiconductor system 400 in accordance with an embodiment may include no address cycle corresponding to the fourth to sixth cycles C4 to C6 in FIG. 9A, command overhead for the data output operation of the semiconductor system 400 can be reduced by a time corresponding to three address cycles compared to the general semiconductor system.

Another data output operation may be performed in parallel before or when the second semiconductor apparatus 420 transmits the data DOUT to the first semiconductor apparatus 410. For example, before or when the data DOUT is transmitted from the first die to the first semiconductor apparatus 410, in a case in which the first semiconductor apparatus 410 has instructed a data output operation of the first die 421 of the second semiconductor apparatus 420 in the first to fifth cycles C1 to C5, the first semiconductor apparatus 410 may instruct a data output operation of the second die 422 of the second semiconductor apparatus 420. The first semiconductor apparatus 410 may transmit a selection signal LS2 to the second semiconductor apparatus 420 in the sixth cycle C6. For example, the selection signal LS2 may include row address information for selecting a specific plane of the second die. The first semiconductor apparatus 410 may transmit the command signal CMD1S corresponding to the start command signal of the random data output command to the second semiconductor apparatus 420 in a seventh cycle C7, transmit the address signal ADD to the second semiconductor apparatus 420 in eighth and ninth cycles C8 and C9, and transmit the command signal CMD1E corresponding to the end command signal of the random data output command to the second semiconductor apparatus 420 in a tenth cycle C10. The sixth to tenth cycles C6 to C10 may partially or completely overlap a period during which the second semiconductor apparatus 420 transmits the data DOUT to the first semiconductor apparatus 410. When the values of the column address signals of the first and second dies 421 and 422 are independently changed based on the selection signals LS1 and LS2, even though the data input operations of the first and second dies 421 and 422 are performed in parallel, a column address signal of a die that performs a first data input operation might not be contaminated by an address signal provided to a die that performs a second data input operation, and design of internal circuits of the first and second dies 421 and 422 can be simplified.

Figure 10A:
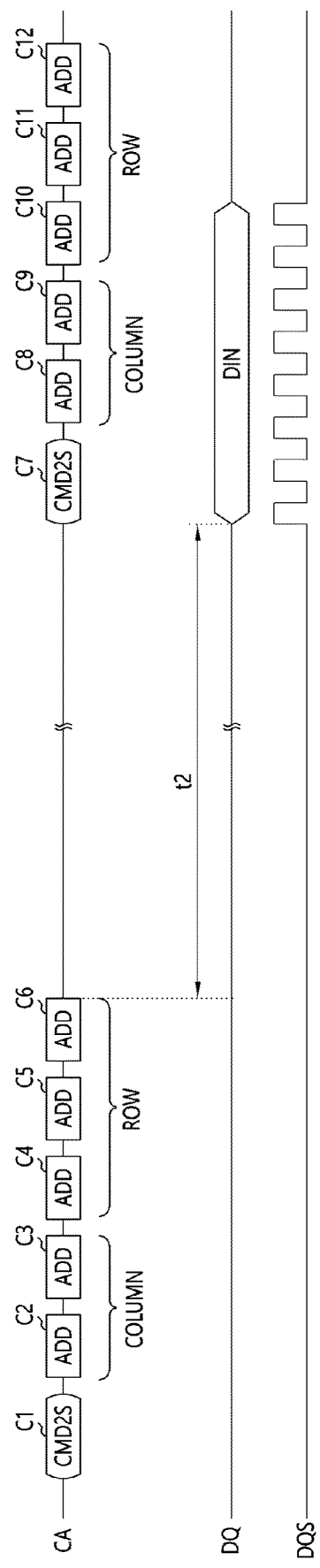
FIG. 10A is a timing diagram illustrating signals transmitted from the general semiconductor system during a data input operation.

FIG. 10A is a timing diagram illustrating signals transmitted in the general semiconductor system during a data input operation. Referring to FIG. 10A, in the general semiconductor system, the first semiconductor apparatus may sequentially provide a command signal CMD2S and an address signal ADD so that the second semiconductor apparatus may perform a data input operation. The first semiconductor apparatus may provide the command signal CMD2S instructing the data input operation to the second semiconductor apparatus in a first cycle C1. The first cycle C1 may be a command cycle. The command signal CMD2S transmitted during the first cycle C1 may be a start command signal of a random data input command. After the command signal CMD2S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. In the first to sixth cycles C1 to C6, the first semiconductor apparatus may transmit the command signal CMD2S and the address signal ADD to the second semiconductor apparatus through the command address bus 401 in FIG. 8. After the address signal ADD is provided, the second semiconductor apparatus may prepare for a data input operation by selecting a specific die and a specific plane based on the address signal ADD during a second time t2. The second time t2 may be tADL of the JEDEC STANDARD. When the second time t2 elapses, the first semiconductor apparatus may transmit data DIN and a data strobe signal DQS synchronized with the data DIN to the second semiconductor apparatus through the data bus 402 and the data strobe bus 404 in FIG. 8.

Another data input operation may be performed in parallel before or when the first semiconductor apparatus transmits the data DIN to the second semiconductor apparatus. For example, before or when the data DIN is transmitted from the first semiconductor apparatus to the first die, in a case in which the first semiconductor apparatus has instructed the data input operation of the first die of the second semiconductor apparatus in the first to sixth cycles C1 to C6, the first semiconductor apparatus may instruct a data input operation of the second die of the second semiconductor apparatus. The first semiconductor apparatus may transmit the command signal CMD2S corresponding to the start command signal of the random data output command to the second semiconductor apparatus in a seventh cycle C7 and may transmit the address signal ADD including the column address information COLUMN and the row address information ROW to the second semiconductor apparatus in eighth to twelfth cycles C8 to C12. The seventh to twelfth cycles C7 to C12 may partially or completely overlap a period during which the second semiconductor apparatus transmits the data DIN to the first semiconductor apparatus. In the general semiconductor system, before or when the data DIN is transmitted to the first die, in a case in which the command signal CMD2S and the address signal ADD are transmitted to the second die, the value of a column address signal of the first die may be changed by the address signal ADD transmitted in the eighth and ninth cycles C8 and C9. Accordingly, when the data input operations of the first and second dies are performed in parallel, each of the first and second dies need to include a complicated internal circuit so that a column address signal of a die that performs a first data input operation is not contaminated by an address signal ADD provided to a die that performs a second data input operation.

Figure 10B:
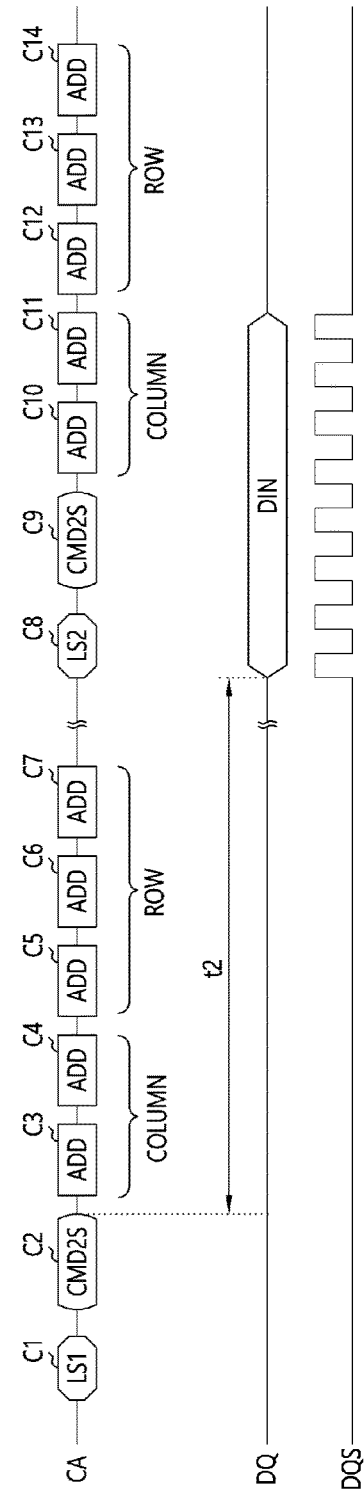
FIG. 10B is a timing diagram illustrating signals transmitted from the semiconductor system in accordance with an embodiment during a data input operation.

FIG. 10B is a timing diagram illustrating signals transmitted from the semiconductor system 400 in accordance with an embodiment during a data input operation. Referring to FIG. 8 and FIG. 10B, in the semiconductor system 400, the first semiconductor apparatus 410 may sequentially provide the selection signal LS1, the command signal CMD2S, and the address signal ADD so that the second semiconductor apparatus 420 may perform a data input operation. In a first cycle C1, the selection signal LS1 may be transmitted to the second semiconductor apparatus 420. The first cycle C1 may be a logical unit number (LUN) selection cycle. The selection signal LS1 may include information for selecting a die and/or a plane that performs a data input operation corresponding to a command signal CMD2S transmitted in a command cycle to be described below. The selection signal LS1 may include row address information for selecting a specific die and specific plane of the second semiconductor apparatus 420. For example, the selection signal LS1 may include row address information for selecting a specific plane of the first die 421 of the second semiconductor apparatus 420. After the selection signal LS1 is provided, the first semiconductor apparatus 410 may provide the command signal CMD2S instructing the data input operation to the second semiconductor apparatus 420 in a second cycle C2. The second cycle C2 may be the command cycle. The command signal CMD2S transmitted during the second cycle C2 may be a start command signal of a random data input command. After the command signal CMD2S is provided, the first semiconductor apparatus 410 may provide the address signal ADD to the second semiconductor apparatus 420 in third to seventh cycles C3 to C7. The third to seventh cycles C3 to C7 may be address cycles. Because the first semiconductor apparatus 410 has transmitted the selection signal for selecting a die and a plane of the second semiconductor apparatus 420 in the first cycle C1, the second semiconductor apparatus 420 may prepare for a data input operation by selecting a specific die and a specific plane based on the selection signal LS1 for the second time t2 from the time point at which the command signal CMD2S is received in the second cycle C2. When the second time t2 elapses, the first semiconductor apparatus 410 may transmit data DIN and a data strobe signal DQS synchronized with the data DIN to the second semiconductor apparatus 420 through the data bus 402 and the data strobe bus 404 in FIG. 5. Because the semiconductor system 400 in accordance with an embodiment may prepare for the data input operation before the address cycle, command overhead for the data input operation of the semiconductor system 400 can be reduced by a time corresponding to five address cycles compared to the general semiconductor system.

Another data input operation may be performed in parallel before or when the first semiconductor apparatus 410 transmits the data DIN to the second semiconductor apparatus 420. For example, before or when the data DIN is transmitted from the first semiconductor apparatus 410 to the first die 421, in a case in which the first semiconductor apparatus 410 has instructed the data input operation of the first die 421 of the second semiconductor apparatus 420 in the first to seventh cycles C1 to C7, the first semiconductor apparatus 410 may instruct a data input operation of the second die 422 of the second semiconductor apparatus 420. The first semiconductor apparatus 410 may transmit the selection signal LS2 to the second semiconductor apparatus 420 in the eighth cycle C8. For example, the selection signal LS2 may include row address information for selecting a specific plane of the second die 422. The first semiconductor apparatus 410 may transmit the command signal CMD2S corresponding to the start command signal of the random data output command to the second semiconductor apparatus 420 in the ninth cycle C9 and may transmit the address signal ADD to the second semiconductor apparatus 420 in tenth to fourteenth cycles C10 to C14. The eighth to fourteenth cycles C8 to C14 may partially or completely overlap a period during which the first semiconductor apparatus 410 transmits the data DIN to the second semiconductor apparatus 420. When the values of the column address signals of the first and second dies 421 and 422 are independently changed based on the selection signals LS1 and LS2, even though the data input operations of the first and second dies 421 and 422 are performed in parallel, a column address signal of a die that performs a first data input operation might not be contaminated by an address signal provided to a die that performs a second data input operation, and design of internal circuits of the first and second dies 421 and 422 can be simplified.

Figure 11:
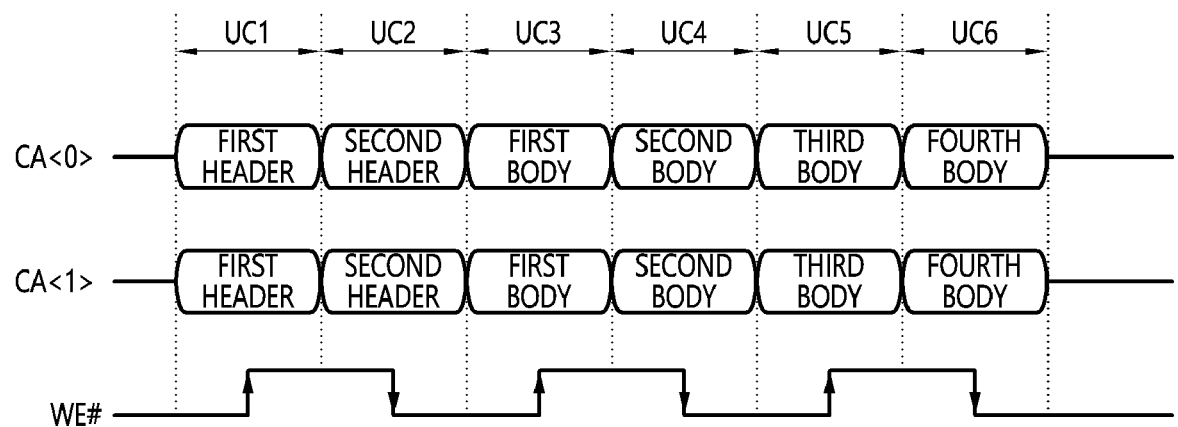
FIG. 11 is a diagram illustrating the configuration of a command address signal in accordance with an embodiment.

FIG. 11 is a diagram illustrating the configuration of command address signals CA<0> and CA<1> in accordance with an embodiment. Referring to FIG. 11, the command address signals CA<0> and CA<1> transmitted during a unit cycle may include 2 bits, and a total of 12-bit command address signals transmitted during 6 unit cycles may constitute one command address signal set. A first header and a second header of the command address signal set may be transmitted in a first unit cycle UC1 and a second unit cycle UC2. During the first unit cycle UC1, first and second bits CA<0> and CA<1> of the first header may be transmitted, and during the second unit cycle UC2, first and second bits CA<0> and CA<1> of the second header may be transmitted. In a third unit cycle UC3, a fourth unit cycle UC4, a fifth unit cycle UC5, and a sixth unit cycle UC6, a first body, a second body, a third body, and a fourth body of the command address signal set may be transmitted, respectively. During the third unit cycle US3, first and second bits CA<0> and CA<1> of the first body may be transmitted, and during the fourth unit cycle UC4, first and second bits CA<0> and CA<1> of the second body may be transmitted. During the fifth unit cycle UC5, first and second bits CA<0> and CA<1> of the third body may be transmitted, and during the sixth unit cycle UC6, first and second bits CA<0> and CA<1> of the fourth body may be transmitted. The command address signal set may be transmitted in synchronization with a command clock signal CCK. The command address signals CA<0> and CA<1> may be transmitted in synchronization with a rising edge and a falling edge of the write enable signal WE #. For example, the first unit cycle UC1 may be synchronized with a first rising edge of the write enable signal WE #, and the first and second bits CA<0> and CA<1> of the first header may be transmitted in synchronization with the first rising edge of the write enable signal WE #. The second unit cycle UC2 may be synchronized with a first falling edge of the write enable signal WE #, and the first and second bits CA<0> and CA<1> of the second header may be transmitted in synchronization with the first falling edge of the write enable signal WE #. The third unit cycle UC3 may be synchronized with a second rising edge of the write enable signal WE #, and the first and second bits CA<0> and CA<1> of the first body may be transmitted in synchronization with a second rising edge of the write enable signal WE #. The fourth unit cycle UC4 may be synchronized with a second falling edge of the write enable signal WE #, and the first and second bits CA<0> and CA<1> of the second body may be transmitted in synchronization with the second falling edge of the write enable signal WE #. The fifth unit cycle UC5 may be synchronized with a third rising edge of the write enable signal WE #, and the first and second bits CA<0> and CA<1> of the third body may be transmitted in synchronization with the third rising edge of the write enable signal WE #. The sixth unit cycle UC6 may be synchronized with a third falling edge of the write enable signal WE #, and the first and second bits CA<0> and CA<1> of the fourth body may be transmitted in synchronization with the third falling edge of the write enable signal WE #.

FIG. 12 is a table illustrating command address signal sets in accordance with an embodiment. Referring to FIG. 12, one command address signal set may include 12 bits. The one command address signal set may include two headers and four bodies. The header may have a total of 4 bits, and the body may have a total of 8 bits. The command address signal set may specify characteristics and/or types of the command address signal set according to logic levels of the bits CA<0> and CA<1> of the first and second headers. When the first and second bits CA<0> and CA<1> of the first header and the second header are at low logic levels, the command address signal set may correspond to a data output command Data Output. When both the first and second bits CA<0> and CA<1> of the first header are at low logic levels, the first bit CA<0> of the second header is at a low logic level, and the second bit CA<1> of the second header is at a high logic level, the command address signal set may correspond to a data input command Data Input. When the first bit CA<0> of the first header is at a high logic level, the second bit CA<1> of the first header is at a low logic level, and both the first and second bits CA0> and CA<1> of the second header are at low logic levels, the command address signal set may correspond to an address input Address Input, and bodies transmitted after the first and second headers may be provided as address signals. When the first bit CA<0> of the first header is at a low logic level, the second bit CA<1> of the first header is at a high logic level, and both the first and second bits CA0> and CA<1> of the second header are at low logic levels, the command address signal set may correspond to command input Command Input, and bodies transmitted after the first and second headers may include information on the type of commands defined by the command address signal sets.

When both the first and second bits CA<0> and CA<1> of the first header are at high logic levels, the first bit CA<0> of the second header is at a high logic level, and the second bit CA<1> of the second header is at a low logic level, the command address signal set may correspond to a selection chip enable command SCE. Bodies transmitted after the first and second headers may include selection information for selecting a die that receives the selection chip enable command SCE. When both the first and second bits CA<0> and CA<1> of the first header are at high logic levels, the first bit CA<0> of the second header is at a low logic level, and the second bit CA<1> of the second header is at a high logic level, the command address signal set may correspond to a selection chip disable command SCD. Bodies transmitted after the first and second headers may include selection information for selecting a die that receives the selection chip disable command SCD. When both the first and second bits CA<0> and CA<1> of the first header and both the first and second bits CA<0> and CA<1> of the second header are at high logic levels, the command address signal set may correspond to a selection chip end command SCT. Bodies transmitted after the first and second headers may include selection information for selecting a die that receives the select chip end command SCT. When both the first and second bits CA<0> and CA<1> of the first header are at high logic levels and both the first and second bits CA<0> and CA<1> of the second header are at low logic levels, the command address signal set may correspond to a selection signal LUN Selection. The selection signal LUN Selection may be a LUN selection command. Bodies transmitted after the first and second headers may include selection information for selecting a die that receives the selection signal LUN Selection. The selection signal LUN Selection may correspond to the selection signals LS1 and LS2 illustrated in FIG. 9B and FIG. 10B, respectively.

The first and second bits CA<0> and CA<1> of the first to fourth bodies transmitted after the first and second headers of each of the selection chip enable command SCE, the selection chip disable command SCD, the selection chip end command SCT, and the selection signal LUN Selection may be used as information for selecting a plurality of dies and/or a plurality of planes. For example, the first and second bits CA<0> and CA<1> of the first and second bodies may be used as information for selecting different dies, and the first and second bits CA<0> and CA<1> of the third and fourth bodies may be used as information for selecting different planes. One of 32 dies may be selected through the first and second bits CA<0> and CA<1> of the first and second bodies, and one of 32 planes may be selected through the first and second bits CA<0> and CA<1> of the third and fourth bodies.

Figure 13A:
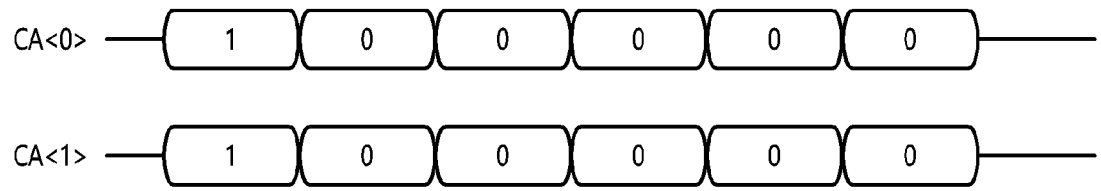
FIG. 13A and FIG. 13B are diagrams illustrating the configuration of a selection chip enable command in accordance with an embodiment.
Figure 13B:
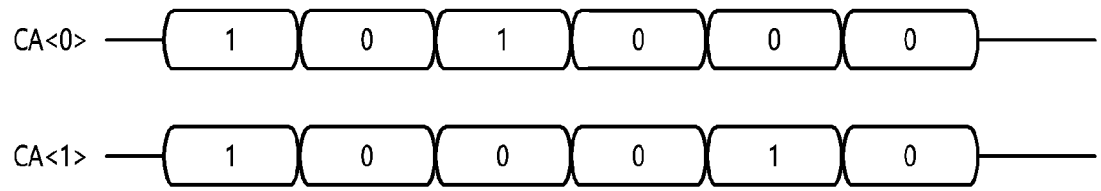

FIG. 13A and FIG. 13B are diagrams illustrating the configuration of the selection signal in accordance with an embodiment. Referring to FIG. 13A, when both the first and second bits CA<0> and CA<1> of the first header of the command address signal set are at high logic levels and both the first and second bits CA<0> and CA<1> of the second header are at low logic levels, the command address signal set may correspond to the selection signal LUN Selection of FIG. 12. For example, when all body bits are at low logic levels, the command address signal set may be the selection signal LUN Selection for selecting the first die 421 illustrated in FIG. 8 and the first plane PL1 of the first die 421.

Referring to FIG. 13B, when both the first and second bits CA<0> and CA<1> of the first header of the command address signal set are at high logic levels and both the first and second bits CA<0> and CA<1> of the second header are at low logic levels, the command address signal set may correspond to the selection signal LUN Selection of FIG. 12. For example, when the first bit CA<0> of the first body and the second bit CA<1> of the third body are at high logic levels and all the other body bits are at low logic levels, the command address signal set may be the selection signal LUN Selection for selecting the second die 422 illustrated in FIG. 8 and the third plane of the second die 422.

Figure 14:
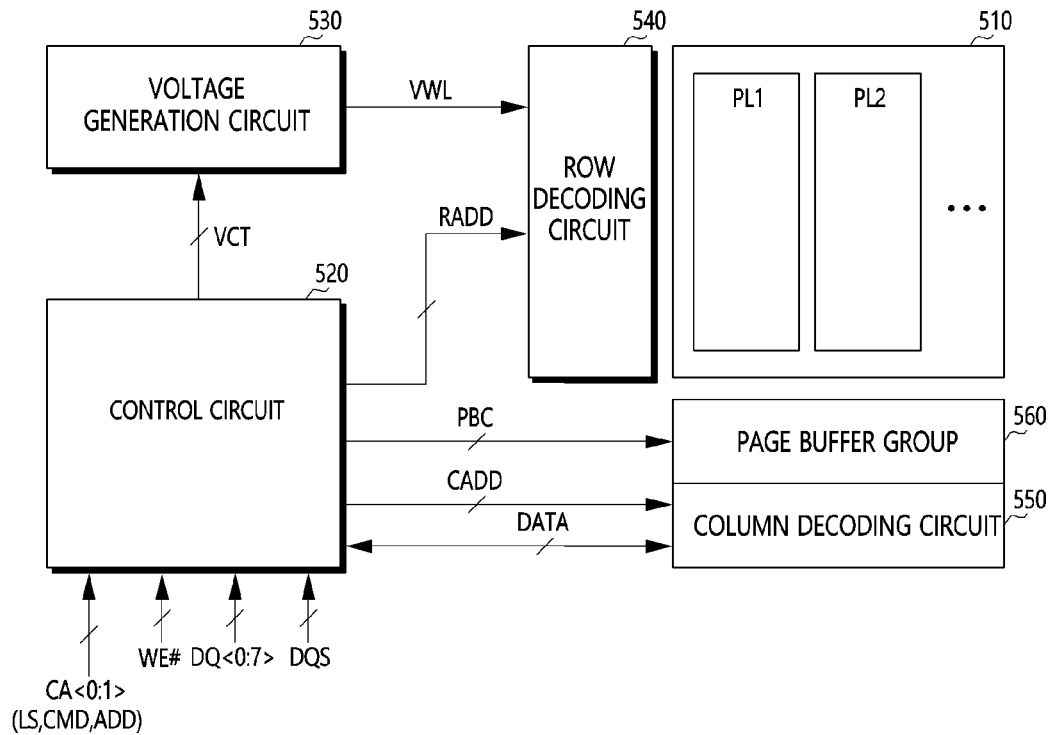
FIG. 14 is a diagram illustrating the configuration of a semiconductor apparatus in accordance with an embodiment.

FIG. 14 is a diagram illustrating the configuration of a semiconductor apparatus 500 in accordance with an embodiment. The semiconductor apparatus 500 may be applied as at least one of the first and second dies 421 and 422 of the second semiconductor apparatus 420 illustrated in FIG. 8. Referring to FIG. 14, the semiconductor apparatus 500 may include a memory cell array 510, a control circuit 520, a voltage generation circuit 530, a row decoding circuit 540, a column decoding circuit 550, and a page buffer group 560. The memory cell array 510 may include a plurality of planes PL1, . . . , PLk. The semiconductor apparatus 500 may have substantially the same configuration as the semiconductor apparatus 200 illustrated in FIG. 6. Redundant descriptions of the same components will be omitted. The control circuit 520 may receive the command address signals CA<0:1> from the first semiconductor apparatus 410 through the command address bus 401 of FIG. 8. The control circuit 520 may receive the command address signals CA<0:1> for a plurality of cycles and generate an internal command signal, an internal address signal, and an internal selection signal. For example, the internal command signal may include 12 bits, and the control circuit 520 may receive the command address signals CA<0:1> for six unit cycles and generate the internal command signal. For example, the internal selection signal may include 12 bits, and the control circuit 520 may receive the command address signals CA<0:1> for six unit cycles and generate the internal selection signal. For example, the internal address signal may include 24 bits, 36 bits, or 60 bits, and the control circuit 520 may receive the command address signal for 12 unit cycles, 18 unit cycles, or 30 unit cycles, and generate the internal address signal. The control circuit 520 may identify the internal command signal, the internal address signal, and the internal selection signal according to the logic levels of the headers of the command address signals CA<0:1>. The internal address signal may include a column address signal CADD, a row address signal RADD, and a plane address signal (not illustrated). The plane address signal may be used to select at least one of the plurality of planes of the memory cell array 510. For example, the control circuit 520 may generate the plane address signal to select at least one of the plurality of planes PL1, . . . , PLK illustrated in FIG. 8. The control circuit 520 may generate the page buffer control signal PBC based on the plane address signal. The control circuit 520 may select and/or activate page buffers connected to a plane selected based on the plane address signal among page buffers of the page buffer group 560. The internal selection signal may be a signal for selecting and/or activating the semiconductor apparatus 500. When the internal selection signal includes information for selecting the semiconductor apparatus 500, the control circuit may activate a command path or a data path of the semiconductor apparatus 500. For example, when the semiconductor apparatus 500 is selected based on the internal selection signal, the control circuit 520 may generate the internal command signal and the internal address signal from the command address signals CA<0:1>.

The control circuit 520 may receive the data DQ<0:7> from the first semiconductor apparatus 410 through the data bus 402 or transmit the data DQ<0:7> to the first semiconductor apparatus 410. The control circuit 520 may include a serializer-deserializer (SERDES) that generates the internal data DATA by parallelizing the data DQ<0:7> or generates the data DQ<0:7> by serializing the internal data DATA. The control circuit 520 may receive the write enable signal WE # from the first semiconductor apparatus 410 through the write control bus 403. The control circuit 520 may receive the data strobe signal DQS from the first semiconductor apparatus 410 through the data strobe bus 404 or transmit the data strobe signal DQS to the first semiconductor apparatus 410. When the semiconductor apparatus 500 is selected based on the internal selection signal, the control circuit 520 may receive the data DQ<0:7> or output the data DQ<0:7>.

In an embodiment, when the internal selection signal generated from the selection signal LS includes information for selecting the semiconductor apparatus 500, the control circuit 520 may generate the column address signal CADD based on the internal address signal. When the internal selection signal includes no information for selecting the semiconductor apparatus 500, the control circuit 520 might not generate the column address signal CADD from the internal address signal.

Figure 15:
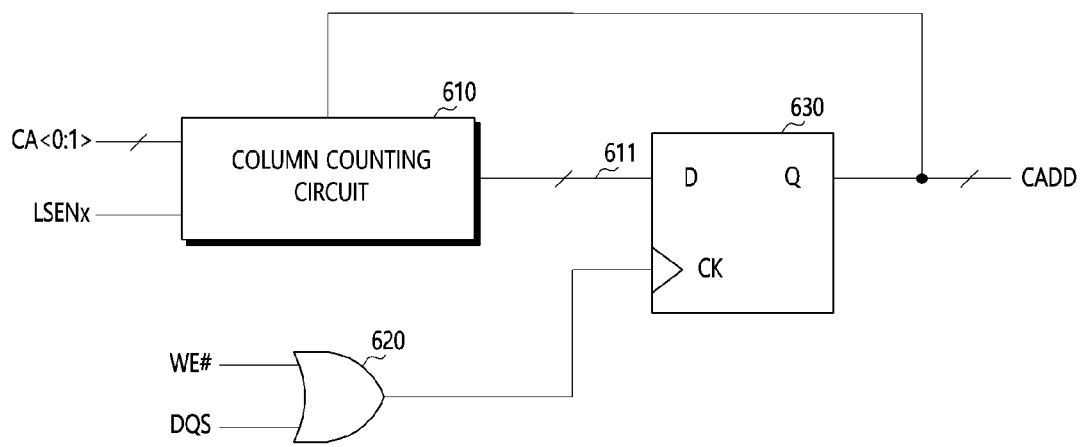
FIG. 15 is a diagram illustrating a control circuit in accordance with an embodiment.

FIG. 15 is a diagram illustrating a control circuit 600 in accordance with an embodiment. The control circuit 600 may be applied as at least a part of the control circuit 520 of FIG. 14. Referring to FIG. 15, the control circuit 600 may generate a column address signal CADD based on the command address signals CA<0:1>, the selection signal LS, the write enable signal WE #, and the data strobe signal DQS. The control circuit 600 may generate the column address signals CADD from the command address signals CA<0:1> based on the selection signal LS. The control circuit 600 may receive a selection enable signal LSENx. The selection enable signal LSENx may be generated based on the selection signal LS. For example, when the selection signal LS includes information for selecting a die including the control circuit 600, the selection enable signal LSENx may be enabled, and when the selection signal LS includes no information for selecting the die including the control circuit 600, the selection enable signal LSENx may be disabled. When the selection enable signal LSENx is enabled, the control circuit 600 may generate the internal address signal from the command address signals CA<0:1> and change a value of the column address signal CADD according to the internal address signal. The control circuit 600 may update the value of the column address signal CADD based on one of the write enable signal WE # and the data strobe signal DQS. The control circuit 600 may set the value of the column address signal CADD to a value corresponding to the internal address signal based on the write enable signal WE #. The control circuit 600 may change the value of the column address signal CADD based on the data strobe signal DQS. The control circuit 600 may increase the value of the column address signal CADD step by step in synchronization with the data strobe signal DQS.

The control circuit 600 may include a column counting circuit 610, a logic gate 620, and a flip-flop 630. The column counting circuit 610 may receive the command address signals CA<0:1>, the selection enable signal LSENx, and the column address signal CADD. When the header of the command address signals CA<0:1> has a specific logic level, the column counting circuit 610 may identify the command address signals CA<0:1> as the address signal ADD of FIG. 10, and generate the internal address signal from the command address signals CA<0:1>. The column counting circuit 610 may receive the column address signals CA<0:1> for four cycles, and generate the internal address signal having 8 bits. When the selection enable signal LENx is enabled, the column counting circuit 610 may output the internal address signal as an output signal 611. The column counting circuit 610 may receive the column address signal CADD, and increase the value of the internal address signal step by step. For example, the column counting circuit 610 may increase the value of the internal address signal by 1 whenever the column address signal CADD is received, and output the internal address signal having the increased value as the output signal 611.

The logic gate 620 may receive the write enable signal WE # and the data strobe signal DQS. When at least one of the write enable signal WE # and the data strobe signal DQS is enabled to a high logic level, the logic gate 620 may generate an output signal having a high logic level. When both the write enable signal WE # and the data strobe signal DQS are disabled, the logic gate 620 may generate an output signal having a low logic level. The logic gate 620 may be an OR gate. An input terminal D of the flip-flop 630 may receive the output signal 611 of the column counting circuit 610, and a clock terminal CK of the flip-flop 630 may receive the output signal of the logic gate 620. The column address signal CADD may be generated from an output terminal Q of the flip-flop 630. When the output signal of the logic gate 620 has a high logic level, the flip-flop 630 may output the output signal 611 of the column counting circuit 610 as the column address signal CADD. The flip-flop 630 may feed back the column address signal CADD to the column counting circuit 610. After the selection enable signal LSENx is enabled, when the write enable signal WE# is enabled, the control circuit 600 may set the value of the column address signal CADD according to the command address signals CA<0:1>. After the value of the column address signal CADD is set, the control circuit 600 may increase the value of the column address signal CADD by 1 whenever the data strobe signal DQS is enabled.

FIG. 16A is a timing diagram illustrating signals transmitted to perform an interleaved operation from the semiconductor system in accordance with an embodiment. Referring to FIG. 8 and FIG. 16A, in the semiconductor system 400, the first semiconductor apparatus 410 may provide a command address signal CA so that the first and second dies 421 and 422 of the second semiconductor apparatus 420 may perform a program operation in a parallel manner. The first semiconductor apparatus 410 may separate one command into two command signals for an interleaved operation of the first and second dies 421 and 422. The first semiconductor apparatus 410 may separate a command for performing a program operation into a first command signal CMD3I and a second command signal CMD3P, and provide the first and second command signals CMD3I and CMD3P at different time points. The first command signal CMD3I may be a part of the command for performing a program operation, and the second command signal CMD3P may be the rest of the command for performing the program operation. For example, the first command signal CMD3I may be a data input command signal, and the second command signal CMD3P may be a program command signal. The data input command signal may be a command signal instructing the second semiconductor apparatus 420 to receive data for the program operation provided from the first semiconductor apparatus 410. The program command signal may be a command signal instructing the first and second dies 421 and 422 of the second semiconductor apparatus 420 to program data for the program operation into a memory cell array. In a first cycle C1, the first semiconductor apparatus 410 may provide a command address signal set corresponding to the first command signal CMD3I to the second semiconductor apparatus 420. The first cycle C1 may be a command cycle. The second to sixth cycles C2 to C6 may be address cycles. In the second to sixth cycles C2 to C6, the first semiconductor apparatus 410 may provide a command address signal set corresponding to the address signal ADD to the second semiconductor apparatus 420, respectively. In the second and third cycles C2 and C3, the first semiconductor apparatus 410 may transmit an address signal ADD including column address information COLUMN for selecting strings of the first and second dies 421 and 422. In the fourth to sixth cycles C4 to C6, the first semiconductor apparatus 410 may transmit the address signal ADD including row address information ROW for selecting the planes PL1, . . . , PLk, the blocks B1, . . . , Bm, and the pages P1, P2, . . . , Pn of the first and second dies 421 and 422 of the second semiconductor apparatus 420. The address signal ADD provided in the fourth to sixth cycles C4 to C6 may include information for selecting the first die 421 of the second semiconductor apparatus 420 and a specific plane of the first die 421. The first semiconductor apparatus 410 may transmit data DQ to the second semiconductor apparatus 420 after providing the address signal ADD. The data DQ may be data DIN1 for a program operation of the first die 421. The first die 421 may prepare for the data input operation based on the first command signal CMD3I and the address signal ADD, and receive the data DIN1 transmitted from the first semiconductor apparatus 410.

To perform a program operation of the second die 422 in parallel with the program operation of the first die 421, the first semiconductor apparatus 410 may provide a command address signal set corresponding to the first command signal CMD3I to the second semiconductor apparatus 420 in a seventh cycle C7, and provide a command address signal set corresponding to the address signal ADD to the second semiconductor apparatus 420 in eighth to twelfth cycles C8 to C12. The seventh cycle C7 may be a command cycle, and the eighth to twelfth cycles C8 to C12 may be address cycles. The seventh to twelfth cycles C7 to C12 may at least partially overlap a period during which the data DIN1 is transmitted. In other words, even before the transmission of the data DIN1 to the second semiconductor apparatus 420 is completed, the first semiconductor apparatus 410 may provide the command signal CMD3I and the address signal ADD to the second semiconductor apparatus 420 in the seventh to twelfth cycles C7 to C12. The address signal ADD provided in the tenth to twelfth cycles C10 to C12 may include information for selecting the second die 422 of the second semiconductor apparatus and a specific plane of the second die 422. The second die 420 may prepare for the data input operation based on the first command signal CMD3I and the address signal ADD. Data DIN2 for the program operation of the second die might not be transmitted yet.

After transmitting the data DIN1 for the program operation of the first die 421, the first semiconductor apparatus 410 may provide a command address signal set corresponding to the third command signal CMD4 to the second semiconductor apparatus 420 in a thirteenth cycle C13. The thirteenth cycle C13 may be a command cycle. The first semiconductor apparatus 410 may provide a command address signal set corresponding to the address signal ADD to the second semiconductor apparatus 420 in fourteenth to sixteenth cycles C14 to C16. The fourteenth to sixteenth cycles C14 to C16 may be address cycles. The third command signal CMD4 may be a state check command signal. The state check command signal may be a command signal for checking whether the first and second dies 421 and 422 of the second semiconductor apparatus 420 are in a busy state in which an operation is currently being performed or in a ready state in which no operation is currently being performed. The first semiconductor apparatus 410 might not provide the third command signal CMD4 to check states of the first and second dies 421 and 422. The first semiconductor apparatus 410 may provide the third command signal CMD4 to the second semiconductor apparatus 420 to select the first die 421 again. Because the first semiconductor apparatus 410 has provided the address signal ADD including information for selecting the second die 422 before the thirteenth cycle C13, the first semiconductor apparatus 410 may need to select the first die 421 again before providing the second command signal CMD3P. Accordingly, the first semiconductor apparatus 410 may provide the third command signal CMD4 and the address signal ADD in the thirteenth to sixteenth cycles C13 to C16, thereby selecting the first die 421 again. The address signal ADD transmitted after the third command signal CMD4 may include only the row address information ROW and might not include the column address information. In a seventeenth cycle C17, the first semiconductor apparatus 410 may provide a command address signal set corresponding to the second command signal CMD3P to the second semiconductor apparatus 420. The seventeenth cycle C17 may be a command cycle.

Because the first semiconductor apparatus 410 is in a state of selecting the first die 421, the first die 421 may receive the second command signal CMD3P and perform the program operation of the data DIN1 based on the second command signal CMD3P. While the first die 421 performs the program operation, the state of the first die 421 may change from a ready state READY to a busy state BUSY.

After providing the second command signal CMD3P to the second semiconductor apparatus 420, the first semiconductor apparatus 410 may transmit the data DIN2 for the program operation of the second die 422 to the second semiconductor apparatus 420. Because the second die 422 is in a state of preparing for the data input operation, the second die 422 may receive the data DIN2 transmitted from the first semiconductor apparatus 410. After transmitting the data DIN2 for the program operation of the second die 422, the first semiconductor apparatus 410 may provide a command address signal set corresponding to the third command signal CMD4 to the second semiconductor apparatus 420 in an eighteenth cycle C18. The eighteenth cycle C18 may be a command cycle. The first semiconductor apparatus 410 may provide a command address signal set corresponding to the address signal ADD to the second semiconductor apparatus 420 in nineteenth to twenty-first cycles C19 to C21. The nineteenth to twenty-first cycles C19 to C21 may be address cycles. The address signal ADD may include information for selecting the second die 422. In the eighteenth to twenty-first cycles C18 to C21, the second die 422 may be selected again while the third command signal CMD4 and the address signal ADD are transmitted. In a twenty-second cycle C22, the first semiconductor apparatus 410 may provide a command address signal set corresponding to the second command signal CMD3P to the second semiconductor apparatus 420. The twenty-second cycle C22 may be a command cycle. Because the first semiconductor apparatus 410 is in a state of selecting the second die 422, the second die 422 may receive the second command signal CMD3P and perform the program operation of the data DIN2 based on the second command signal CMD3P. While the second die 422 performs the program operation, the state of the second die 422 may change from a ready state READY to a busy state BUSY.

Figure 16B:
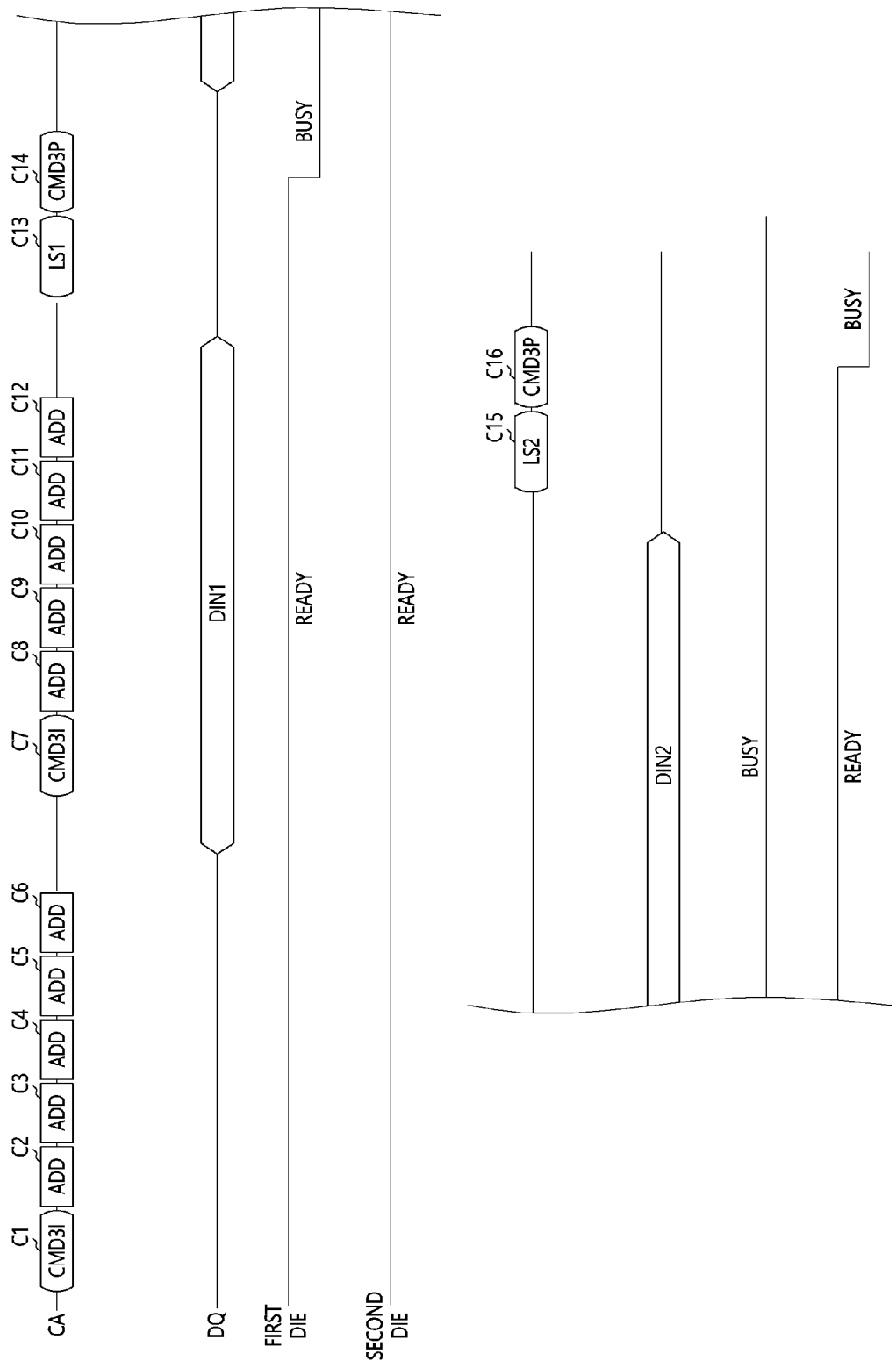
FIG. 16B is a timing diagram illustrating signals transmitted to perform an interleaved operation—from a semiconductor system in accordance with an embodiment.

FIG. 16B is a timing diagram illustrating signals transmitted to perform an interleaved operation from the semiconductor system in accordance with an embodiment. Referring to FIG. 8 and FIG. 16B, in the semiconductor system 400, the first semiconductor apparatus 410 may provide the command address signal CA so that the first and second dies 421 and 422 of the second semiconductor apparatus 420 may perform a program operation in a parallel manner. The first semiconductor apparatus 410 may reduce command overhead by providing a selection signal by using a LUN selection cycle. The first semiconductor apparatus 410 may replace the thirteenth to sixteenth cycles C13 to C16 and the eighteenth to twenty-first cycles C18 to C21 illustrated in FIG. 16A with one LUN selection cycle, respectively. In a first cycle C1, the first semiconductor apparatus 410 may provide a command address signal set corresponding to the first command signal CMD3I to the second semiconductor apparatus 420. The first cycle C1 may be a command cycle. The first semiconductor apparatus 410 may provide a command address signal set corresponding to an address signal ADD to the second semiconductor apparatus 420 in second to sixth cycles C2 to C6, respectively. The second to sixth cycles C2 to C6 may be address cycles. The address signal ADD provided in the fourth to sixth cycles C4 to C6 may include information for selecting the first die 421 of the second semiconductor apparatus 420 and a specific plane of the first die 421. After providing the address signal ADD, the first semiconductor apparatus 410 may transmit data DIN1 for a program operation of the first die 421 to the second semiconductor apparatus 420. The first die 421 may prepare for the data input operation based on the first command signal CMD3I and the address signal ADD, and receive the data DIN1 transmitted from the first semiconductor apparatus 410.

To perform a program operation of the second die 422 in parallel with the program operation of the first die 421, the first semiconductor apparatus 410 may provide a command address signal set corresponding to the first command signal CMD3I to the second semiconductor apparatus 420 in a seventh cycle C7, and provide a command address signal set corresponding to the address signal ADD to the second semiconductor apparatus 420 in eighth to twelfth cycles C8 to C12. The seventh cycle C7 may be a command cycle, and the eighth to twelfth cycles C8 to C12 may be address cycles. The address signal ADD provided in the tenth to twelfth cycles C10 to C12 may include information for selecting the second die 422 of the second semiconductor apparatus and a specific plane of the second die 422. The second die 420 may prepare for the data input operation based on the first command signal CMD3I and the address signal ADD. Data DIN2 for the program operation of the second die 422 might not be transmitted yet.

After transmitting the data DIN1 for the program operation of the first die 421, the first semiconductor apparatus 410 may provide a command address signal set corresponding to a first selection signal LS1 to the second semiconductor apparatus 420 in a thirteenth cycle C13. The thirteenth cycle C13 may be a LUN selection cycle. The first die 421 may be selected by the first selection signal LS1 provided in the LUN selection cycle. In a fourteenth cycle C14, the first semiconductor apparatus 410 may provide a command address signal set corresponding to the second command signal CMD3P to the second semiconductor apparatus 420. Because the first semiconductor apparatus 410 is in a state of selecting the first die 421, the first die 421 may receive the second command signal CMD3P and perform the program operation of the data DIN1 based on the second command signal CMD3P. While the first die 421 performs the program operation, the state of the first die 421 may change from a ready state READY to a busy state BUSY.

After providing the second command signal CMD3P to the second semiconductor apparatus 420, the first semiconductor apparatus 410 may transmit the data DIN2 for the program operation of the second die 422 to the second semiconductor apparatus 420. Because the second die 422 is in a state of preparing for the data input operation, the second die 422 may receive the data DIN2 transmitted from the first semiconductor apparatus 410. After transmitting the data DIN2 for the program operation of the second die 422, the first semiconductor apparatus 410 may provide a command address signal set corresponding to a second selection signal LS2 to the second semiconductor apparatus 420 in a fifteenth cycle C15. The fifteenth cycle C15 may be a LUN selection cycle. The second die 422 may be selected again by the second selection signal LS2 provided in the LUN selection cycle. In a sixteenth cycle C16, the first semiconductor apparatus 410 may provide a command address signal set corresponding to the second command signal CMD3P to the second semiconductor apparatus 420. Because the first semiconductor apparatus 410 is in a state of selecting the second die 422, the second die 422 may receive the second command signal CMD3P and perform the program operation of the data DIN2 based on the second command signal CMD3P. While the second die 422 performs the program operation, the state of the second die 422 may change from a ready state READY to a busy state BUSY. The first semiconductor apparatus 410 may transmit the first and second selection signals LS1 and LS2 through the LUN selection cycle, thereby replacing the thirteenth to sixteenth cycles C13 to C16 of FIG. 16A with one cycle and replacing the eighteenth to twenty-first cycles C18 to C21 with one cycle. Accordingly, it is possible to reduce the time corresponding to a total of six cycles and transmission of a total of six command address signal sets, so that command overhead can be reduced.

Figure 17:
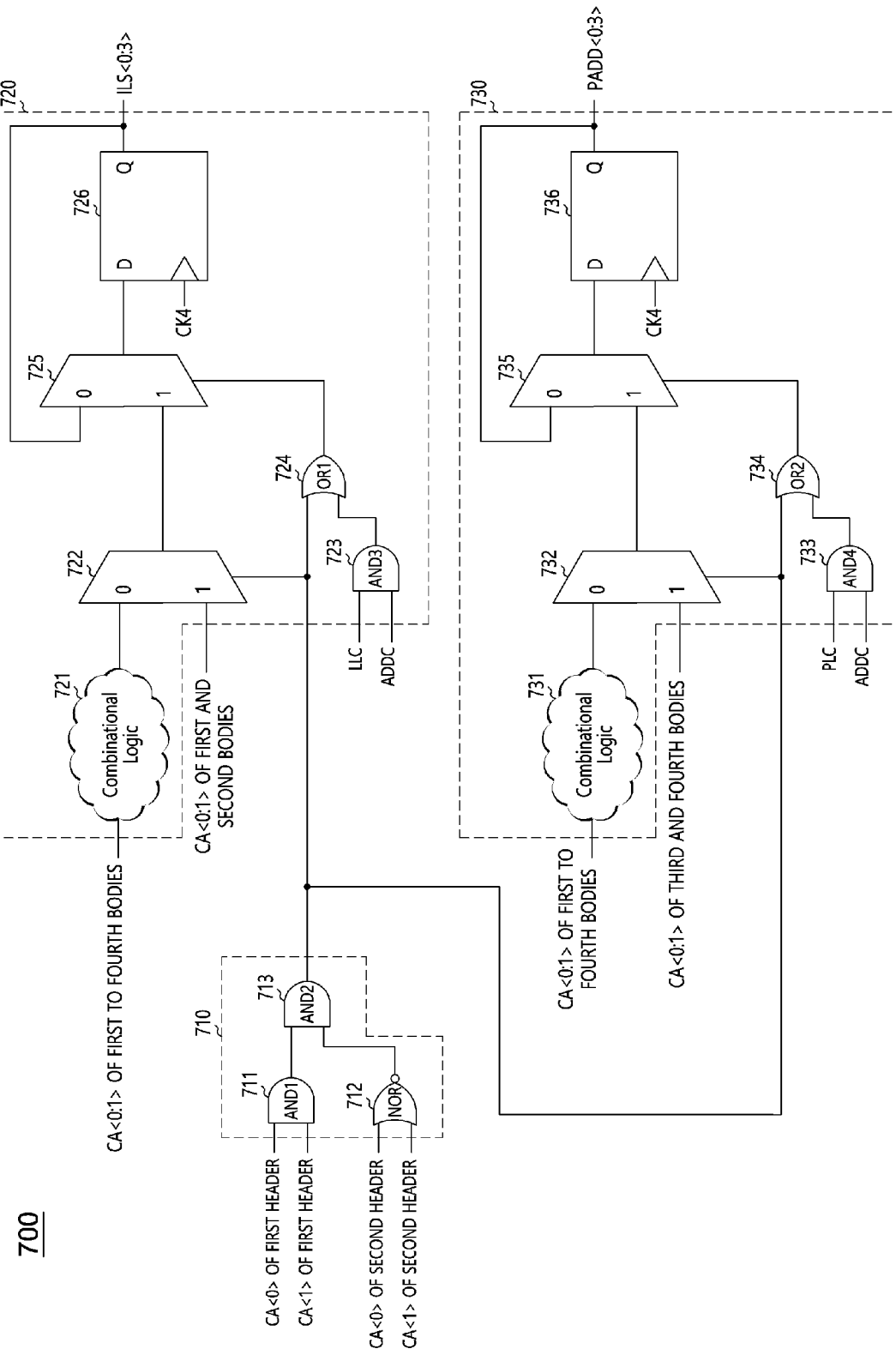
FIG. 17 is a diagram illustrating the configuration of at least a part of a control circuit in accordance with an embodiment.

FIG. 17 is a diagram illustrating the configuration of at least a part of a control circuit 700 in accordance with an embodiment. Referring to FIG. 14 and FIG. 17, the control circuit 700 may generate internal selection signals ILS<0:3> and plane address signals PADD<0:3> based on a command address signal set provided in the LUN selection cycle or the address cycle. The control circuit 700 may be applied as at least a part of the control circuit 520 illustrated in FIG. 14. The control circuit 700 may receive the command address signal set including a header and a body. When the command address signal set corresponds to one of the address signal ADD and the selection signal LS based on the logic levels of the bits CA<0:1> of the header, the control circuit 700 may generate the internal selection signals ILS<0:3> and the plane address signals PADD<0:3> based on the bits CA<0:1> of the body. The control circuit 700 may change values of the internal selection signals ILS<0:3> and the plane address signals PADD<0:3> according to the logic levels of the bits CA<0:1> of the body. When the command address signal set corresponds to the selection signal LS, the control circuit 700 may change the internal selection signals ILS<0:3> and the plane address signals PADD<0:3> based on the bits CA<0:1> of the body included in the selection signal LS. When the command address signal set corresponds to the address signal ADD, the control circuit 700 may change the internal selection signals ILS<0:3> and the plane address signals PADD<0:3> based on the bits CA<0:1> of the body included in the address signal ADD.

The control circuit 700 may include a header determination circuit 710, a selection signal generation circuit 720, and a plane address signal generation circuit 730. The header determination circuit 710 may generate a selection enable signal LCS based on the bits CA<0:1> of the header of the command address signal set. The header determination circuit 710 may selectively enable the selection enable signal LCS according to the logic levels of the bits CA<0:1> of the header. The header determination circuit 710 may determine whether the command address signal set corresponds to the selection signal LS by sensing the logic levels of the bits CA<0:1> of a first header and the bits CA<0:1> of a second header. For example, the header determination circuit 710 may generate the selection enable signal LSC by determining whether the command address signal set corresponds to the selection signal LUN Selection illustrated in FIG. 12. When the first and second bits CA<0> and CA<1> of the first header have first logic levels and the first and second bits CA<0> and CA<1> of the second header have second logic levels, the header determination circuit 710 may enable the selection enable signal LCS. When any one of the first and second bits CA<0> and CA<1> of the first header has a second logic level or any one of the first and second bits CA<0> and CA<1> of the second header has a first logic level, the header determination circuit 710 may maintain the selection enable signal LCS in a disabled state.

The selection signal generation circuit 720 may receive the selection enable signal LCS and a part of the bits CA<0:1> of the body included in the command address signal set corresponding to the selection signal LS. The bits CA<0:1> of the body may be bits of the body input together with the bits CA<0:1> of the header input to enable the selection enable signal LCS. The selection signal generation circuit 720 may receive the bits CA<0:1> of the first and second bodies among the bits of the body included in the selection signal LS. The selection signal generation circuit 720 may generate the internal selection signals ILS<0:3> based on the selection enable signal LCS and the bits CA<0:1> of the first and second bodies. When the selection enable signal LCS is enabled, the selection signal generation circuit 720 may change the values of the internal selection signals ILS<0:3> based on the bits CA<0:1> of the first and second bodies. The values of the internal selection signals ILS<0:3> may be changed according to the logic levels of the bits CA<0:1> of the first and second bodies. The selection signal generation circuit 720 may receive the bits CA<0:1> of the body included in the address signal ADD provided in the address cycle, an address enable signal ADDC, and a selection condition signal LLC. The address enable signal ADDC may be a signal that is enabled when the command address signal set corresponds to the address signal ADD. For example, when the bits of the header of the command address signal set have a logic level corresponding to the address input Address Input of FIG. 12, the address enable signal ADDC may be enabled. The address enable signal ADDC may be enabled in the address cycle. The selection condition signal LLC may be enabled at a timing at which an address signal ADD including information for selecting the die is input during the address cycle. For example, referring to FIG. 16A, the selection condition signal LLC may be enabled at a timing at which the address signal ADD of the sixth cycle C6 is input during the second to sixth cycles C2 to C6. When both the address enable signal ADDC and the selection condition signal LLC are enabled, the selection signal generation circuit 720 may generate the internal selection signals ILS<0:3> based on a part of the bits CA<0:1> of the first to fourth bodies included in the address signal ADD. The selection signal generation circuit 720 may change the values of the internal selection signal ILS<0:3> according to the logic levels of a part of the bits CA<0:1> of the first to fourth bodies included in the address signal ADD. When the values of the internal selection signals ILS<0:3> match information identifying the die including the control circuit 700, the die may be selected, and the die may be in a state capable of receiving the command signal and/or the address signal.

The plane address signal generation circuit 730 may receive the selection enable signal LCS and another part of the bits CA<0:1> of the body included in the command address signal set corresponding to the selection signals LS. The bits CA<0:1> of the body may be bits of the body input together with the bits CA<0:1> of the header input to enable the selection enable signal LCS. The plane address signal generation circuit 730 may receive bits CA<0:1> of third and fourth bodies among the bits of the body included in the selection signal LS. The plane address signal generation circuit 730 may generate the plane address signals PADD<0:3> based on the selection enable signal LCS and the bits CA<0:3> of the third and fourth bodies. When the selection enable signal LCS is enabled, the selection signal generation circuit 730 may change the values of the plane address signals PADD<0:3> based on the bits CA<0:1> of the third and fourth bodies. The values of the plane address signals PADD<0:3> may be changed according to the logic levels of the bits CA<0:1> of the third and fourth bodies. The plane address signal generation circuit 730 may receive the bits CA<0:1> of the body included in the address signal ADD provided in the address cycle, the address enable signal ADDC, and a plane condition signal PLC. The plane condition signal PLC may be enabled at a timing at which an address signal ADD including information for selecting a specific plane is input during the address cycle. For example, referring to FIG. 16A, the plane condition signal PLC may be enabled at a timing at which the address signal ADD of the fifth cycle C5 is input during the second to sixth cycles C2 to C6. When both the address enable signal ADDC and the plane condition signal PLC are enabled, the plane address signal generation circuit 730 may generate the plane address signals PADD<0:3> based on another part of the bits CA<0:1> of the first to fourth bodies included in the address signal ADD. The another part of the bits CA<0:1> of the first to fourth bodies used by the plane address signal generation circuit 730 may be different from a part of the bits CA<0:1> of the first to fourth bodies used by the selection signal generation circuit 720. The plane address signal generation circuit 730 may change the values of the plane address signals PADD<0:3> according to the logic levels of the another part of the bits CA<0:1> of the first to fourth bodies.

The header determination circuit 710 may include a first logic gate 711, a second logic gate 712, and a third logic gate 713. A first input terminal of the first logic gate 711 may receive the first bit CA<0> of the first header, and a second input terminal of the first logic gate 711 may receive the second bit CA<1> of the first header. When both the first and second bits CA<0> and CA<1> of the first header are at high logic levels, the first logic gate 711 may output an output signal having a high logic level. The first logic gate 711 may include a first AND gate AND1. A first input terminal of the second logic gate 712 may receive the first bit CA<0> of the second header, and a second input terminal of the second logic gate 712 may receive the second bit CA<1> of the second header. When both the first and second bits CA<0> and CA<1> of the second header are at low logic levels, the second logic gate 712 may output an output signal having a high logic level. The second logic gate 712 may include a NOR gate NOR. A first input terminal of the third logic gate 713 may receive the output signal of the first logic gate 711, and a second input terminal of the third logic gate 713 may receive the output signal of the second logic gate 712, and the selection enable signal LCS may be output from an output terminal of the third logic gate 713. When both the output signals of the first and second logic gates 711 and 712 are at high logic levels, the third logic gate 713 may enable the selection enable signal LCS to a high logic level. The third logic gate 713 may include a second AND gate AND2.

The selection signal generation circuit 720 may include a first combinational logic 721, a first multiplexer 722, a third logic gate 723, a fourth logic gate 724, a second multiplexer 725, and a first flip-flop 726. The first combinational logic 721 may receive the bits CA<0:1> of the first to fourth bodies of the command address signal set corresponding to the address signal ADD, and output some bits among the bits CA<0:1> of the first to fourth bodies. For example, the first combinational logic 721 may output the bits CA<0:1> of the first and second bodies among the bits CA<0:1> of the first to fourth bodies. The first multiplexer 722 may receive the bits CA<0:1> of the first and second bodies included in the command address signal set corresponding to the selection signal LS and the output signal of the first combinational logic 721. The first multiplexer 722 may receive the selection enable signal LCS as a control signal. The first multiplexer 722 may selectively output one of the bits CA<0:1> of the first and second bodies included in the selection signal LS and the output signal of the first combinational logic 721 based on the selection enable signal LCS. When the selection enable signal LCS is enabled to a high logic level, the first multiplexer 722 may output the bits CA<0:1> of the first and second bodies. When the selection enable signal LCS is disabled to a low logic level, the first multiplexer 722 may output the output signal of the first combinational logic 721. A first input terminal of the third logic gate 723 may receive the address enable signal ADDC, and a second input terminal of the third logic gate 723 may receive the selection condition signal LLC. When both the address enable signal ADDC and the selection condition signal LLC are at high logic levels, the third logic gate 723 may output an output signal having a high logic level. The third logic gate 723 may include a third AND gate AND3. A first input terminal of the fourth logic gate 724 may receive the selection enable signal LCS, and a second input terminal of the fourth logic gate 724 may receive the output signal of the third logic gate 723. When any one of the selection enable signal LCS and the output signal of the third logic gate 723 is at a high logic level, the fourth logic gate 724 may output an output signal having a high logic level. The fourth logic gate 724 may include a first OR gate OR1.

The second multiplexer 725 may receive the output signal of the first multiplexer 722 and the internal selection signals ILS<0:3>. The second multiplexer 725 may receive the output signal of the fourth logic gate 724 as a control signal. The second multiplexer 725 may selectively output one of the output signal of the first multiplexer 722 and the internal selection signals ILS<0:3> based on the output signal of the fourth logic gate 724. When the output signal of the fourth logic gate 724 is at a high logic level, the second multiplexer 725 may output the output signal of the first multiplexer 722. When the output signal of the fourth logic gate 724 is at a low logic level, the second multiplexer 725 may output the internal selection signals ILS<0:3>. An input terminal of the first flip-flop 726 may receive the output signal of the second multiplexer 725, a clock terminal of the first flip-flop 726 may receive a clock signal CK4, and the internal selection signals ILS<0:3> may be output from an output terminal of the first flip-flop 726. The internal selection signals ILS<0:3> may be fed back to the second multiplexer 725. The first flip-flop 726 may be a D flip-flop. The clock signal CK4 may be generated by dividing or delaying the write enable signal WE # illustrated in FIG. 8 and FIG. 12. The first flip-flop 726 may output, as the internal selection signals ILS<0:3>, the output signal of the second multiplexer 725 received through the input terminal at a rising edge of the clock signal CK4.

When a command address signal set corresponding to the selection signal LS is input in the LUN selection cycle, because the selection enable signal LCS is enabled to a high logic level, the first multiplexer 722 may output the bits CA<0:1> of the first and second bodies included in the selection signal LS. The second multiplexer 725 may output the bits CA<0:1> of the first and second bodies included in the selection signal LS to the first flip-flop 726, and the bits CA<0:1> of the first and second bodies included in the selection signal LS may be provided as the internal selection signals ILS<0:3> in synchronization with the rising edge of the clock signal CK4. In the address cycle, when a command address signal set corresponding to the address signal ADD is input and both the address enable signal ADDC and the selection condition signal LLC are enabled to high logic levels, the first multiplexer 722 may output the output signal of the first combinational logic 721, and the second multiplexer 725 may output a part of the bits CA<0:1> of the first to fourth bodies included in the address signal to the first flip-flop 726. The first flip-flop 726 may provide a part of the bits CA<0:1> of the first to fourth bodies included in the address signal ADD as the internal selection signals ILS<0:3> in synchronization with the rising edge of the clock signal CK4. In a cycle other than the LUN selection cycle or the address cycle, because both the selection enable signal LCS and the address enable signal ADDC are disabled to low logic levels, the second multiplexer 725 may provide the internal selection signal ILS<0:3> to the first flip-flop 726, and the values of the internal selection signals ILS<0:3> may remain the same.

The plane address signal generation circuit 730 may include a second combinational logic 731, a third multiplexer 732, a fifth logic gate 733, a sixth logic gate 734, a fourth multiplexer 735, and a second flip-flop 736. The second combinational logic 731 may receive the bits CA<0:1> of the first to fourth bodies included in the command address signal set corresponding to the address signal ADD, and output some other bits among the bits CA<0:1> of the first to fourth bodies. For example, the second combinational logic 731 may output the bits CA<0:1> of the third and fourth bodies among the bits CA<0:1> of the first to fourth bodies. The third multiplexer 732 may receive the bits CA<0:1> of the third and fourth bodies included in the command address signal set corresponding to the selection signal LS and the output signal of the second combinational logic 731. The third multiplexer 732 may receive the selection enable signal LCS as a control signal. The third multiplexer 732 may selectively output one of the bits CA<0:1> of the third and fourth bodies included in the selection signal LS and the output signal of the second combinational logic 731 based on the selection enable signal LCS. When the selection enable signal LCS is enabled to a high logic level, the third multiplexer 732 may output the bits CA<0:1> of the third and fourth bodies included in the selection signal LS. When the selection enable signal LCS is disabled to a low logic level, the third multiplexer 732 may output the output signal of the second combinational logic 731. A first input terminal of the fifth logic gate 733 may receive the address enable signal ADDC, and a second input terminal of the fifth logic gate 733 may receive the plane condition signal PLC. When both the address enable signal ADDC and the plane condition signal PLC are at high logic levels, the fifth logic gate 733 may output an output signal having a high logic level. The fifth logic gate 733 may include a fourth AND gate AND4. A first input terminal of the sixth logic gate 734 may receive the selection enable signal LCS, and a second input terminal of the sixth logic gate 734 may receive the output signal of the fifth logic gate 733. When any one of the selection enable signal LCS and the output signal of the fifth logic gate 733 is at a high logic level, the sixth logic gate 734 may output an output signal having a high logic level. The sixth logic gate 734 may include a second OR gate OR2.

The fourth multiplexer 735 may receive the output signal of the third multiplexer 732 and the plane address signals PADD<0:3>. The fourth multiplexer 735 may receive the output signal of the sixth logic gate 734 as a control signal. The fourth multiplexer 735 may selectively output one of the output signal of the third multiplexer 732 and the plane address signals PADD<0:3> based on the output signal of the sixth logic gate 734. When the output signal of the sixth logic gate 734 is at a high logic level, the fourth multiplexer 735 may output the output signal of the third multiplexer 732. When the output signal of the sixth logic gate 734 is at a low logic level, the fourth multiplexer 735 may output the plane address signals PADD<0:3>. An input terminal of the second flip-flop 736 may receive the output signal of the fourth multiplexer 735, a clock terminal of the second flip-flop 736 may receive the clock signal CK4, and the plane address signals PADD<0:3> may be output from an output terminal of the second flip-flop 736. The plane address signals PADD<0:3> may be fed back to the fourth multiplexer 735. The second flip-flop 736 may be a D flip-flop. The second flip-flop 736 may output, as the plane address signals PADD<0:3>, the output signal of the fourth multiplexer 735 received through the input terminal at the rising edge of the clock signal CK4.

In the LUN selection cycle, when a command address signal set corresponding to the selection signal LS is input, because the selection enable signal LCS is enabled to a high logic level, the third multiplexer 732 may output the bits CA<0:1> of the third and fourth bodies included in the selection signal LS. The fourth multiplexer 735 may output the bits CA<0:1> of the third and fourth bodies included in the selection signal LS to the second flip-flop 736, and the bits CA<0:1> of the third and fourth bodies included in the selection signal LS may be provided as the plane address signals PADD<0:3> in synchronization with the rising edge of the clock signal CK4. When a command address signal set corresponding to the address signal ADD is input in the address cycle and both the address enable signal ADDC and the plane condition signal PLC are enabled to high logic levels, the third multiplexer 732 may output the output signal of the second combinational logic 731, and the fourth multiplexer 735 may output another part of the bits CA<0:1> of the first to fourth bodies included in the address signal ADD to the second flip-flop 736. The second flip-flop 736 may provide the another part of the bits CA<0:1> of the first to fourth bodies included in the address signal ADD as the plane address signals PADD<0:3> in synchronization with the rising edge of the clock signal CK4. In a cycle other than the LUN selection cycle or the address cycle, because the selection enable signal LCS, the address enable signal ADDC, and the plane condition signal PLC are all disabled to low logic levels, the fourth multiplexer 735 may provide the plane address signals PADD<0:3> to the second flip-flop 736, and the values of the plane address signals PADD<0:3> may remain the same.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims presented below rather than the detailed description, and it should be construed that all changes or modified forms derived from the meaning and scope of the claims and the equivalent concept thereof are included in the scope of the present disclosure.

What is claimed is:
1. A semiconductor system comprising:
a first semiconductor apparatus configured to provide an input and output signal through an input and output bus, and to selectively enable a command latch enable signal and an address latch enable signal when transmitting the input and output signal; and
a second semiconductor apparatus configured to receive the input and output signal as one of a selection signal, a command signal, an address signal, and data based on the command latch enable signal and the address latch enable signal, wherein, when both the command latch enable signal and the address latch enable signal are enabled, the second semiconductor apparatus receives the input and output signal as the selection signal.

2. The semiconductor system according to claim 1, wherein, when the command latch enable signal is enabled and the address latch enable signal is disabled, the second semiconductor apparatus receives the input and output signal as the command signal.

3. The semiconductor system according to claim 1, wherein, when the address latch enable signal is enabled and the command latch enable signal is disabled, the second semiconductor apparatus receives the input and output signal as the address signal.

4. The semiconductor system according to claim 1, wherein, when both the command latch enable signal and the address latch enable signal are disabled, the second semiconductor apparatus receives the input and output signal as the data.

5. The semiconductor system according to claim 1, wherein the second semiconductor apparatus includes a first die and a second die, and wherein the selection signal includes information for selecting one of the first and second dies.

6. The semiconductor system according to claim 1, wherein the second semiconductor apparatus includes a first die and a second die, wherein the first die and the second die each include a memory cell array including a plurality of planes each including a plurality of blocks, and wherein the selection signal includes information for selecting one of the first die and the second die and at least one of a plurality of planes of a selected die.

7. The semiconductor system according to claim 1, wherein the first semiconductor apparatus provides the input and output signal including the selection signal to the second semiconductor apparatus before providing the input and output signal including the command signal to the second semiconductor apparatus.

8. The semiconductor system according to claim 7, wherein the first semiconductor apparatus provides the input and output signal including the address signal to the second semiconductor apparatus after providing the input and output signal including the command signal to the second semiconductor apparatus.

9. The semiconductor system according to claim 8, wherein the first semiconductor apparatus provides the input and output signal including the data to the second semiconductor apparatus or receives the input and output signal including the data from the second semiconductor apparatus after providing the input and output signal including the address signal to the second semiconductor apparatus.

10. The semiconductor system according to claim 1, wherein the second semiconductor apparatus includes a first die and a second die, and wherein the first die and the second die each include a control circuit that generates an internal command signal and an internal selection signal from the input and output signal based on the command latch enable signal and the address latch enable signal.

11. The semiconductor system according to claim 10, wherein the control circuit comprises:

a command generation circuit configured to change a value of the internal command signal according to the input and output signal when the command latch enable signal is enabled and the address latch enable signal is disabled, and to maintain the value of the internal command signal when the command latch enable signal is disabled; and a selection signal generation circuit configured to change a value of the internal selection signal according to the input and output signal when both the command latch enable signal and the address latch enable signal are enabled, and to maintain the value of the internal selection signal when one of the command latch enable signal and the address latch enable signal is disabled.

12. A semiconductor system comprising:

a first semiconductor apparatus configured to provide a command address signal through a command address bus and to provide data through a data bus; and a second semiconductor apparatus configured to receive the data from the first semiconductor apparatus or to transmit data to the first semiconductor apparatus through the data bus based on the command address signal, wherein the command address signal includes a selection signal, a command signal, and an address signal, and the first semiconductor apparatus sequentially provides the selection signal, the command signal, and the address signal.

13. The semiconductor system according to claim 12, wherein the second semiconductor apparatus includes a first die and a second die, and wherein the selection signal includes information for selecting one of the first and second dies.

14. The semiconductor system according to claim 12, wherein the second semiconductor apparatus includes a first die and a second die, wherein the first die and the second die each include a memory cell array including a plurality of planes each including a plurality of blocks, and wherein the selection signal includes information for selecting one of the first die and the second die and at least one of a plurality of planes of a selected die.

15. The semiconductor system according to claim 14, wherein the second semiconductor apparatus includes a first die and a second die, and wherein the first die and the second die each include a control circuit that sets a value of a column address signal based on the address signal and the selection signal and increases the value of the column address signal step by step based on at least one of a write enable signal and the data strobe signal.

16. The semiconductor system according to claim 12, wherein the first semiconductor apparatus transmits the data to the second semiconductor apparatus in synchronization with a data strobe signal, and the second semiconductor apparatus transmits the data to the first semiconductor apparatus in synchronization with the data strobe signal.

* * * * *